(12) United States Patent
Kim et al.

(10) Patent No.: US 12,557,530 B2
(45) Date of Patent: Feb. 17, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Seungrae Kim, Yongin-si (KR); Seulki Kim, Yongin-si (KR); Yeeun Kang, Yongin-si (KR); Jaehyun Lee, Yongin-si (KR); Jongbum Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 376 days.

(21) Appl. No.: 18/232,918

(22) Filed: Aug. 11, 2023

(65) Prior Publication Data

US 2024/0224721 A1 Jul. 4, 2024

(30) Foreign Application Priority Data

Jan. 3, 2023 (KR) .................. 10-2023-0000907

(51) Int. Cl.

| H10K 59/80 | (2023.01) |
| H10K 59/12 | (2023.01) |
| H10K 59/124 | (2023.01) |
| H10K 71/16 | (2023.01) |
| H10K 71/20 | (2023.01) |

(52) U.S. Cl.
CPC ....... *H10K 59/873* (2023.02); *H10K 59/1201* (2023.02); *H10K 59/124* (2023.02); *H10K 71/166* (2023.02); *H10K 71/231* (2023.02)

(58) Field of Classification Search
None
See application file for complete search history.

(56) References Cited

U.S. PATENT DOCUMENTS

| 10,720,604 B2 | 7/2020 | Kim et al. |
| 10,777,771 B2 * | 9/2020 | Lee ..................... H10K 59/124 |
| 10,930,884 B2 | 2/2021 | Lee et al. |

(Continued)

FOREIGN PATENT DOCUMENTS

| CN | 112542087 A | 3/2021 |
| KR | 1020190096471 | 8/2019 |

(Continued)

*Primary Examiner* — Anne M Hines
(74) *Attorney, Agent, or Firm* — CANTOR COLBURN LLP

(57) ABSTRACT

A display apparatus includes a substrate, a first insulating layer disposed on the substrate in a display area and a peripheral area of the substrate, a thin-film transistor disposed on the substrate in the display area, a light-emitting diode electrically connected to the thin-film transistor and including a sub-pixel electrode, an encapsulation layer disposed on the light-emitting diode and including a first inorganic encapsulation layer, a second inorganic encapsulation layer, and an organic encapsulation layer between the first inorganic encapsulation layer and the second inorganic encapsulation layer, and a first dam portion and a second dam portion, which are disposed on the first insulating layer of the peripheral area and arranged in a direction from the display area toward the peripheral area, where a first valley is defined through the first insulating layer between the first dam portion and the second dam portion.

23 Claims, 25 Drawing Sheets

(56) References Cited

U.S. PATENT DOCUMENTS

| | | |
|---|---|---|
| 11,574,970 B2 | 2/2023 | Kim et al. |
| 12,075,661 B2 * | 8/2024 | Moon ................ H10K 59/124 |
| 2021/0091163 A1 | 3/2021 | Son et al. |
| 2021/0111371 A1 | 4/2021 | Cho et al. |

FOREIGN PATENT DOCUMENTS

| | | |
|---|---|---|
| KR | 1020200047941 | 6/2020 |
| KR | 1020210044942 | 4/2021 |

* cited by examiner

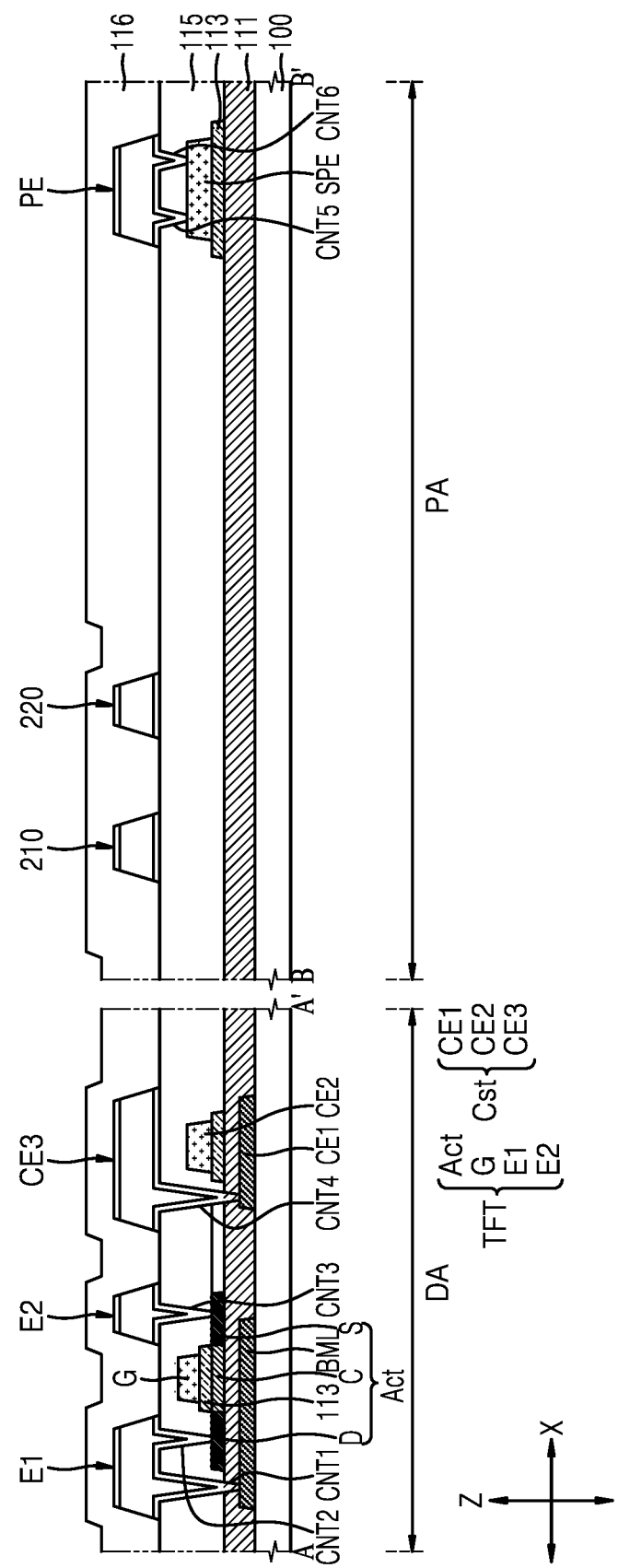

DISPLAY APPARATUS AND METHOD OF MANUFACTURING THE SAME

This application claims priority to Korean Patent Application No. 10-2023-0000907, filed on Jan. 3, 2023, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus.

2. Description of the Related Art

As various electronic apparatuses such as mobile phones, personal digital assistants (PDAs), computers, and large-sized televisions (TVs) have been developed, various types of display apparatuses that are applicable thereto have also been developed. For example, liquid crystal display apparatuses including a backlight unit and organic light-emitting display apparatuses that emit light having different colors in each color area have been widely used in the market. Recently, display apparatuses including a quantum dot color conversion layer (QD-CCL) have been developed.

In addition, in general, an organic light-emitting diode display apparatus includes, on a substrate, a sub-pixel circuit including a thin-film transistor, and organic light-emitting diodes, and the organic light-emitting diodes emit light by themselves to operate. In a process of forming a sub-pixel circuit and organic light-emitting diodes on a substrate, a plurality of photolithography processes using a mask may be used. A photolithography process is a series of processes of transferring a pattern designed on a mask onto a substrate on which a thin film, such as a metal layer, an organic layer, or an inorganic layer, are deposited, and forming a desired pattern on the thin film, and the photolithography process includes application, exposure, development, etc.

Recently, the use of display apparatuses has diversified. Also, as the thicknesses and weights of the display apparatuses have decreased, the range of applications of the display apparatuses has increased. Recently, various attempts have been made to make designs for improving the quality of display apparatuses.

SUMMARY

One or more embodiments provide a display apparatus capable of reducing the number of masks applied to a manufacturing process, improving productivity, and preventing an occurrence of defects in a light-emitting element, and a method of manufacturing the display apparatus.

According to one or more embodiments, a display apparatus includes a substrate including a display area and a peripheral area outside the display area, a first insulating layer disposed on the substrate in the display area and the peripheral area, a thin-film transistor disposed on the substrate in the display area, a light-emitting diode electrically connected to the thin-film transistor and including a sub-pixel electrode, an emission layer, and an opposite electrode, an encapsulation layer disposed on the light-emitting diode and including a first inorganic encapsulation layer, a second inorganic encapsulation layer, and an organic encapsulation layer between the first inorganic encapsulation layer and the second inorganic encapsulation layer, and a first dam portion and a second dam portion, which are disposed on the first insulating layer of the peripheral area and arranged in a direction from the display area toward the peripheral area, where a first valley passing is defined through the first insulating layer between the first dam portion and the second dam portion.

According to an embodiment, the display apparatus may further include a second insulating layer between the first insulating layer and the sub-pixel electrode of the light-emitting diode, where an opening overlapping the peripheral area is defined through the second insulating layer, and a second valley overlapping the first valley may be defined through the second insulating layer.

According to an embodiment, the first inorganic encapsulation layer and the second inorganic encapsulation layer may extend to the peripheral area, and a first portion of the first inorganic encapsulation layer and a first portion of the second inorganic encapsulation layer may be in direct contact with each other on the first dam portion.

According to an embodiment, the first inorganic encapsulation layer may be in contact with an inorganic insulating layer under the first insulating layer, through the first valley.

According to an embodiment, an end the first inorganic encapsulation layer and an end of the second inorganic encapsulation layer may be disposed on the second dam portion.

According to an embodiment, the end of the first inorganic encapsulation layer or the end of the second inorganic encapsulation layer may be aligned with an edge of the second dam portion, on a plane.

According to an embodiment, the second insulating layer may include a first portion overlapping the sub-pixel electrode, and a second portion extending from the first portion, and an upper surface of the second insulating layer may have a step between the first portion and the second portion.

According to an embodiment, a vertical distance from the substrate to an upper surface of the first portion may be greater than a vertical distance from the substrate to an upper surface of the second portion.

According to one or more embodiments, a display apparatus includes a substrate including a display area and a peripheral area outside the display area, a first insulating layer disposed on the substrate in the display area and the peripheral area, a thin-film transistor disposed on the substrate in the display area, a light-emitting diode electrically connected to the thin-film transistor and including a sub-pixel electrode, an emission layer, and an opposite electrode, an encapsulation layer disposed on the light-emitting diode and including a first inorganic encapsulation layer, a second inorganic encapsulation layer, and an organic encapsulation layer between the first inorganic encapsulation layer and the second inorganic encapsulation layer, and a first dam portion and a second dam portion, which are disposed on the first insulating layer of the peripheral area and arranged in a direction from the display area toward the peripheral area, where an end of the first inorganic encapsulation layer and an end of the second inorganic encapsulation layer is disposed on the second dam portion, and the end of the first inorganic encapsulation layer or the end of the second inorganic encapsulation layer is aligned with an edge of the second dam portion, on a plane.

According to an embodiment, the second dam portion may include a first sub-layer and a second sub-layer disposed on the first sub-layer, and a first side surface of the first sub-layer and a first side surface of the second sub-layer may be defined by a same etching surface.

According to an embodiment, a first side surface of the second dam portion may be perpendicular to an upper surface of the substrate.

According to an embodiment, the display apparatus may further include a second insulating layer between the first insulating layer and the sub-pixel electrode of the light-emitting diode, where an opening overlapping the peripheral area may be defined through the second insulating layer, the second insulating layer may include a first portion overlapping the sub-pixel electrode, and a second portion extending from the first portion, and an upper surface of the second insulating layer may have a step between the first portion and the second portion.

According to an embodiment, a vertical distance from the substrate to an upper surface of the first portion may be greater than a vertical distance from the substrate to an upper surface of the second portion.

According to one or more embodiments, a method of manufacturing a display apparatus includes preparing a substrate including a display area and a peripheral area outside the display area, forming a thin-film transistor on the substrate in the display area, forming a first insulating layer on the substrate in the display area to cover the thin-film transistor and in the peripheral area, forming a light-emitting diode on the first insulating layer of the display area, where the light-emitting diode is electrically connected to the thin-film transistor and includes a sub-pixel electrode, an emission layer, and an opposite electrode, forming an encapsulation layer on the light-emitting diode, where the encapsulation layer includes a first inorganic encapsulation layer, a second inorganic encapsulation layer, and an organic encapsulation layer between the first inorganic encapsulation layer and the second inorganic encapsulation layer, and forming a first dam portion and a second dam portion on the first insulating layer of the peripheral area, where the first dam portion and the second dam portion are arranged in a direction from the display area toward the peripheral area, where a first valley is formed through the first insulating layer between the first dam portion and the second dam portion.

According to an embodiment, the method may further include forming a second insulating layer between the first insulating layer and the sub-pixel electrode of the light-emitting diode, where a second valley overlapping the first valley may be formed through the second insulating layer.

According to an embodiment, the forming the second insulating layer may be performed by using a half-tone mask.

According to an embodiment, the first inorganic encapsulation layer may be in contact with an inorganic insulating layer under the first insulating layer, through the first valley.

According to an embodiment, the forming the second dam portion may include forming a preliminary second dam portion on the first insulating layer of the peripheral area, and etching the preliminary second dam portion by using the encapsulation layer as an etching mask.

According to an embodiment, the second dam portion may include a first sub-layer and a second sub-layer disposed on the first sub-layer, and a first side surface of the first sub-layer and a first side surface of the second sub-layer may be defined by a same etching surface.

According to an embodiment, a first side surface of the second dam portion may be perpendicular to an upper surface of the substrate.

According to an embodiment, an end of the first inorganic encapsulation layer or an end of the second inorganic encapsulation layer may be aligned with an edge of the second dam portion, on a plane.

According to an embodiment, the second insulating layer may include a first portion overlapping the sub-pixel electrode, and a second portion extending from the first portion, and an upper surface of the second insulating layer may have a step between the first portion and the second portion.

According to an embodiment, a vertical distance from the substrate to an upper surface of the first portion may be greater than a vertical distance from the substrate to an upper surface of the second portion.

BRIEF DESCRIPTION OF THE DRAWINGS

The above and other features of certain embodiments of the disclosure will be more apparent from the following description taken in conjunction with the accompanying drawings, in which:

FIGS. 6A to 6L are cross-sectional views of a method of manufacturing a display apparatus, according to an embodiment;

DETAILED DESCRIPTION

Figure 1:
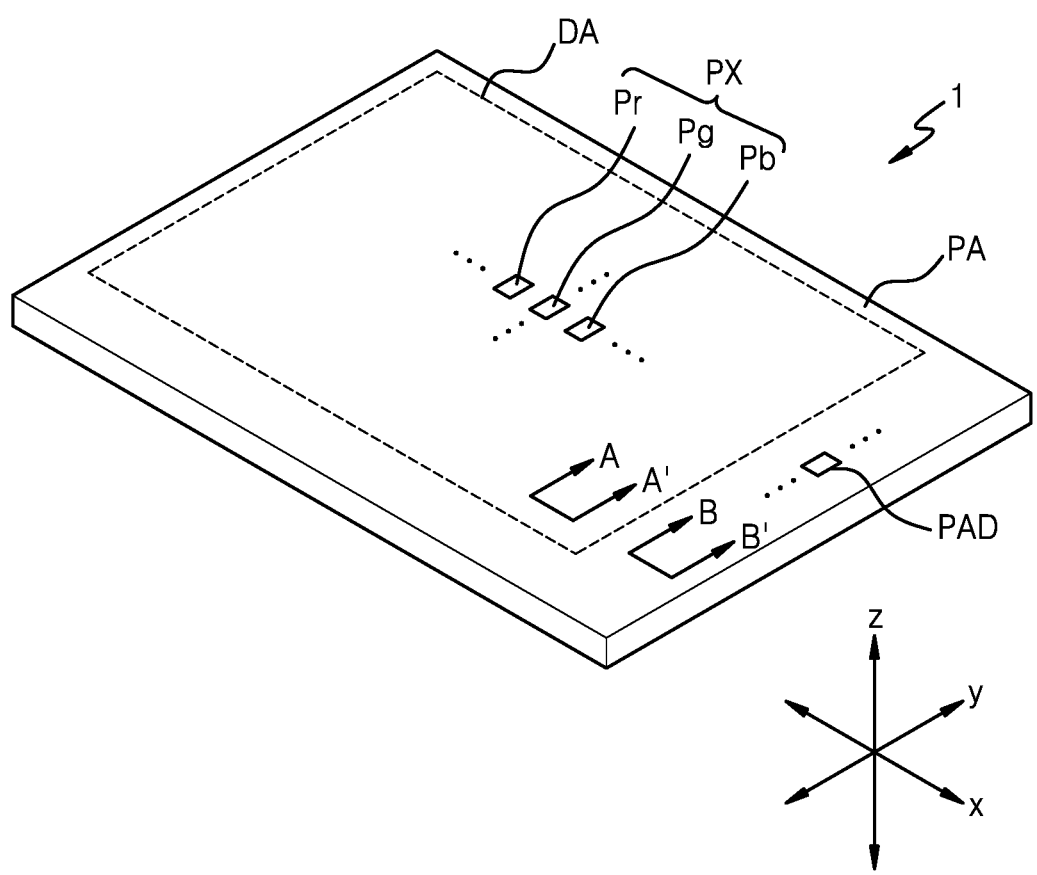
FIG. 1 is a schematic perspective view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As various modifications may be applied and numerous embodiments may be implemented, particular embodiments will be illustrated in the drawings and described in detail in the written description. Effects and features, and methods for achieving them will be clarified with reference to embodiments described below in detail with reference to the drawings. However, the embodiments may have different forms and should not be construed as being limited to the descriptions set forth herein.

It will be understood that, although terms such as "first" and "second" may be used herein to describe various elements, these elements should not be limited by these terms, and these terms are only used to distinguish one element from another.

It will be understood that terms, such as "comprise," "include," and "have," used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, e.g., intervening layers, regions, or elements may be present.

As used herein, the expression such as "A and/or B" indicates A, B, or A and B. Also, as used herein, the expression such as "at least one of A and B" or "at least one selected from A and B" indicates A, B, or A and B.

In the following embodiments, the expression "a line extends in a first direction or a second direction" may include a case in which "a line extends in a linear shape" and a case in which "a line extends in a zigzag or curved shape in a first direction or a second direction."

In the following embodiments, when an element is referred to as being "on a plane," it is understood that the element is viewed from the top, and when an element is referred to as being "on a cross-section," it is understood that the element is vertically cut and viewed from the side. In the following embodiments, when elements "overlap" each other, the elements overlap each other "on a plane" or "a cross-section."

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, one or more embodiments will be described in detail with reference to the accompanying drawings, and like reference numerals in the drawings denote like reference elements.

FIG. 1 is a perspective view of a display apparatus 1 according to an embodiment.

Referring to FIG. 1, an embodiment of the display apparatus 1 may include a display area DA and a peripheral area PA outside the display area DA. The display apparatus 1 may provide an image through an array of a plurality of sub-pixels PX that are two-dimensionally arranged on an x-y plane (i.e., a plane defined by a x direction and a y direction) in the display area DA. Here, a z direction (or Z direction) may be a thickness direction of the display apparatus 1 (or a substrate therein). The plurality of sub-pixels PX may include a first sub-pixel, a second sub-pixel, and a third sub-pixel. Hereinafter, for convenience of description, embodiments where the first sub-pixel includes a red sub-pixel Pr, the second sub-pixel includes a green sub-pixel Pg, and the third sub-pixel includes a blue sub-pixel Pb will be described, but not being limited thereto.

The red sub-pixel Pr, the green sub-pixel Pg, and the blue sub-pixel Pb are areas through which red, green, and blue light may be emitted, respectively, and the display apparatus 1 may provide an image by using light emitted from the sub-pixels PX.

The peripheral area PA may be an area where an image is not provided, and the peripheral area PA may entirely or partially surround the display area DA. Various wires for providing an electrical signal or power to sub-pixel circuits, and a pad portion PAD to which a printed circuit board or a driver integrated circuit (IC) chip is attached may be arranged in the peripheral area PA.

The display area DA may have a polygonal shape including a quadrangle, as shown in FIG. 1. In an embodiment, for example, the display area DA may have a rectangular shape with a horizontal length greater than a vertical length, a rectangular shape with a horizontal length less than a vertical length, or a square shape. Alternatively, the display area DA may have various shapes, such as an ellipse or a circle.

Figure 2:
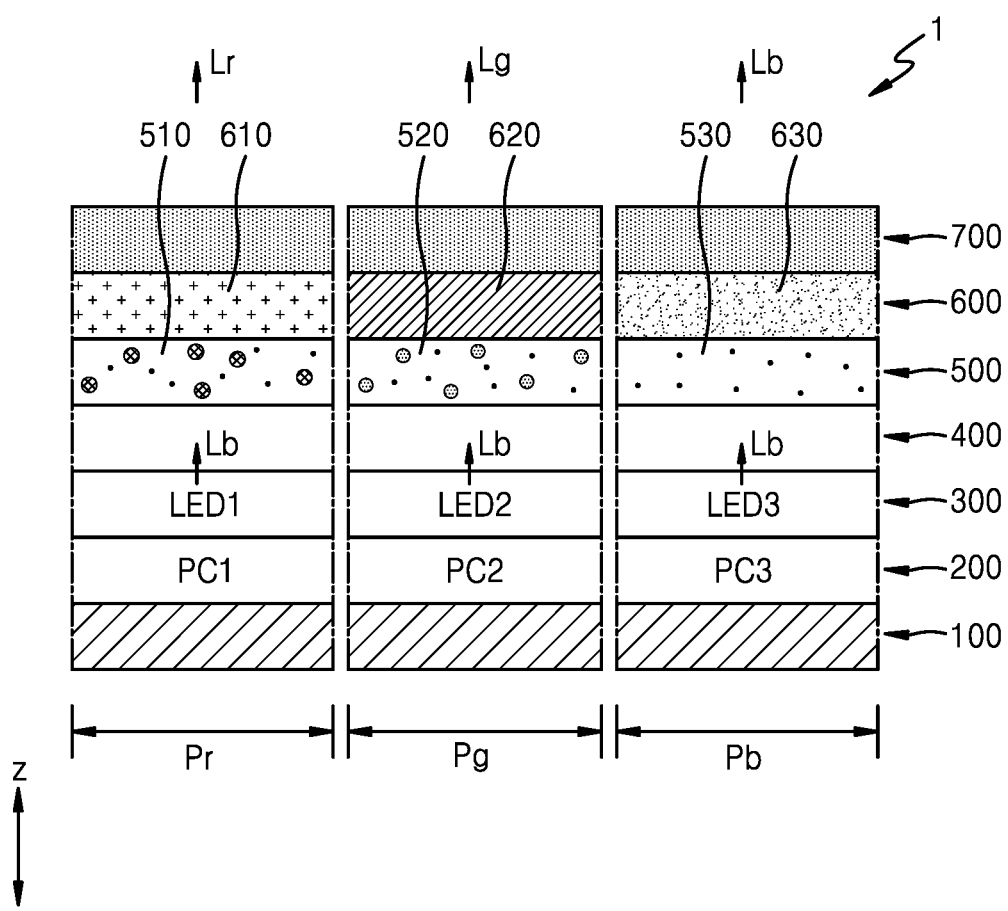
FIG. 2 is a schematic cross-sectional view of a display apparatus according to an embodiment.

FIG. 2 is a schematic cross-sectional view of each sub-pixel of the display apparatus 1, according to an embodiment.

Referring to FIG. 2, an embodiment of the display apparatus 1 may include a circuit layer 200 on a substrate 100. The circuit layer 200 may include first to third sub-pixel circuits PC1, PC2, and PC3, and the first to third sub-pixel circuits PC1, PC2, and PC3 may be electrically connected to first to third light-emitting diodes LED1, LED2, and LED3 of a light-emitting diode layer 300, respectively.

In an embodiment, the first to third light-emitting diodes LED1, LED2, and LED3 may each include an organic light-emitting diode including an organic material. In an alternative embodiment, the first to third light-emitting diodes LED1, LED2, and LED3 may each include an inorganic light-emitting diode including an inorganic material. The inorganic light-emitting diode may include a PN junction diode including inorganic semiconductor-based materials. When a forward voltage is applied to the PN-junction diode, holes and electrons are injected and energy created by recombination of the holes and the electrons is converted into light energy, and thus, light having a preset color may be emitted. The aforementioned inorganic light-emitting diode may have a width of several to hundreds of micrometers or several to several hundreds of nanometers. In some embodiments, the first to third light-emitting diodes LED1, LED2, and LED3 may each include a light-emitting diode including quantum dots. As described above, emission layers of the first to third light-emitting diodes LED1, LED2, and LED3 may each include an organic material, include an inorganic material, include quantum dots, include an organic material and quantum dots, or include an inorganic material or quantum dots. Hereinafter, for convenience of description, embodiments where the first to third light-emitting diodes LED1, LED2, and LED3 each include an organic light-emitting diode will be described in detail, but not being limited thereto.

The first to third light-emitting diodes LED1, LED2, and LED3 may emit light having the same color. In an embodiment, for example, light (e.g., blue light Lb) emitted from the first to third light-emitting diodes LED1, LED2, and LED3 may pass through a functional layer 500 after passing through an encapsulation layer 400 on the light-emitting diode layer 300.

The functional layer 500 may include optical portions that convert the color of the light (e.g., the blue light Lb) emitted from the light-emitting diode layer 300 or transmit the light without converting the color thereof. In an embodiment, for example, the functional layer 500 may include color conversion portions that convert the light (e.g., the blue light Lb) emitted from the light-emitting diode layer 300 to light having another color, and a transmission portion that transmits the light (e.g., the blue light Lb) emitted from the light-emitting diode layer 300 without converting the color of the light. The functional layer 500 may include a first color conversion portion 510 corresponding to the red sub-pixel Pr, a second color conversion portion 520 corresponding to the green sub-pixel Pg, and a transmission portion 530 corresponding to the blue sub-pixel Pb. The first color conversion portion 510 may convert the blue light Lb into red light Lr, and the second color conversion portion 520 may convert the blue light Lb into green light Lg. The transmission portion 530 may pass the blue light Lb without converting the color thereof.

A color layer 600 may be disposed on the functional layer 500. The color layer 600 may include first to third color filters 610, 620, and 630 of different colors. In an embodiment, for example, the first color filter 610 may be a red color filter, the second color filter 620 may be a green color filter, and the third color filter 630 may be a blue color filter.

Light color-converted by and light transmitted by the functional layer 500 pass through the first to third color filters 610, 620, and 630, such that color purity may be improved. Also, the color layer 600 may effectively prevent or reduce external light (e.g., light incident from the outside of the display apparatus 1 toward the display apparatus 1) from being reflected and seen by a user.

A transmissive substrate layer 700 may be disposed on the color layer 600. The transmissive substrate layer 700 may include a transmissive organic material, such as glass or an acrylic resin.

In an embodiment, the transmissive substrate layer 700 is a type of substrate, the substrate 100 may be a lower substrate, and the transmissive substrate layer 700 may be an upper substrate disposed on the lower substrate. After the color layer 600 and the functional layer 500 are formed over the transmissive substrate layer 700, the functional layer 500 may be disposed on or attached to the encapsulation layer 400, such that the functional layer 500 faces the encapsulation layer 400. In an embodiment, for example, a display panel (not shown) in which the circuit layer 200, the light-emitting diode layer 300, and the encapsulation layer 400 are sequentially stacked on the lower substrate (i.e., the substrate 100) is formed, and a color panel (not shown) in which the color layer 600 and the functional layer 500 are sequentially stacked on the upper substrate, and then, the color panel and the display panel may be bonded to each other by making the functional layer 500 of the color panel face the encapsulation layer 400 of the display panel.

A filler and/or a sealing member (not shown) may be between the display panel and the color panel. In an embodiment, for example, the sealing member may be disposed on the substrate 100 and surround the display area (see FIG. 1) in a plan view. The sealing member may overlap the peripheral area PA (see FIG. 1) in a plan view. Accordingly, an inner space between the display panel and the color panel may be sealed, and a filler may be arranged in the inner space.

In an embodiment, the sealing member may include a sealant. In an embodiment, the sealing member may include a material cured by laser. In an embodiment, for example, the sealing member may include a frit. In addition, the sealing member may include a material cured by heat.

In an alternative embodiment, after the functional layer 500 and the color layer 600 are sequentially formed over the encapsulation layer 400, the transmissive substrate layer 700 may be formed on the color layer 600 by being directly applied and cured on the color layer 600.

In some embodiments, another optical film, e.g., an anti-reflection (AR) film, may be disposed on the transmissive substrate layer 700.

The display apparatus 1 having the aforementioned structure may be an electronic device that may display a video or a still image, such as a television, a billboard, a movie theater screen, a monitor, a tablet personal computer, or a laptop computer.

Figure 3:
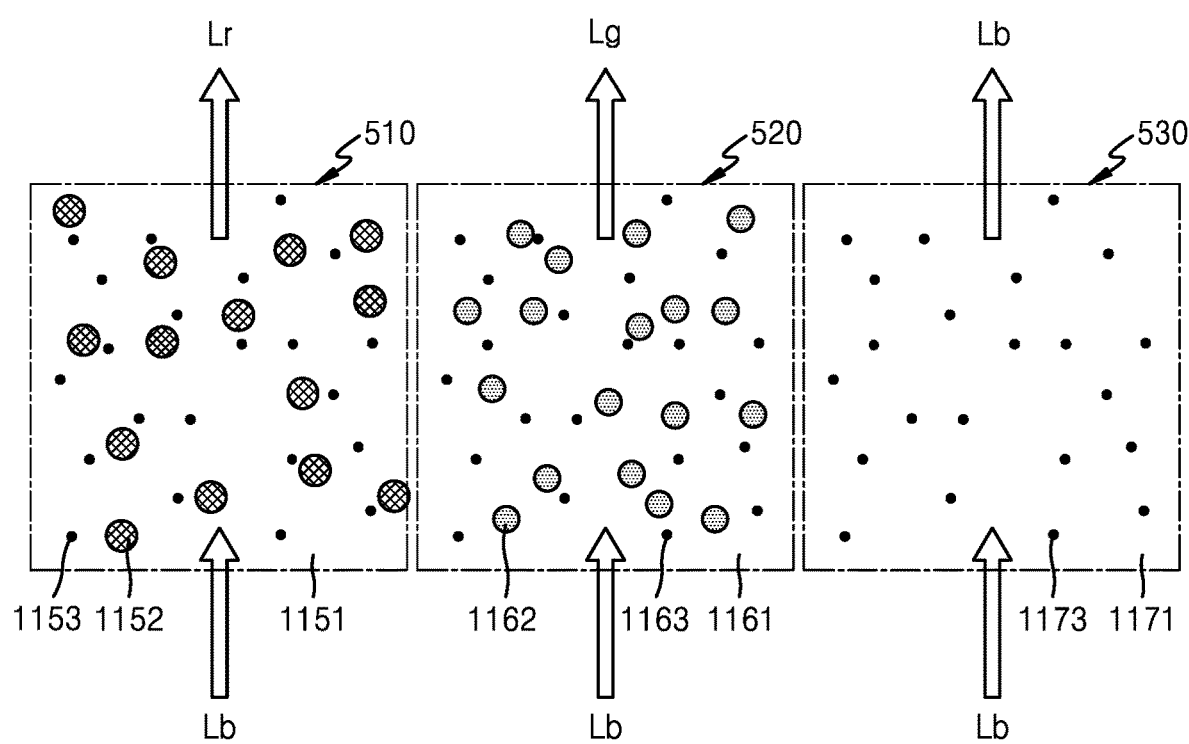
FIG. 3 is a diagram of each optical layer of a functional layer of FIG. 2.

FIG. 3 is a diagram of each optical portion of the functional layer 500 of FIG. 2.

Referring to FIG. 3, the first color conversion portion 510 may convert incident blue light Lb into red light Lr. As shown in FIG. 3, the first color conversion portion 510 may include a first photosensitive polymer 1151, and first quantum dots 1152 and first scattering particles 1153 dispersed in the first photosensitive polymer 1151.

The first quantum dots 1152 may be excited by the blue light Lb to isotropically emit the red light Lr having a wavelength lower than a wavelength of the blue light Lb. The first photosensitive polymer 1151 may include an organic material having light transmission properties. The first scattering particles 1153 scatter the blue light Lb that is not absorbed by the first quantum dots 1152 to cause more first quantum dots 1152 to be excited, such that color conversion efficiency may be increased. The first scattering particles 1153 may include, e.g., titanium oxide ($TiO_2$) or metal particles. The first quantum dots 1152 may be selected from a group II-VI compound, a group III-V compound, a group IV-VI compound, a group IV element, a group IV compound, and any combinations thereof.

The second color conversion portion 520 may convert the incident blue light Lb into green light Lg. As shown in FIG. 3, the second color conversion portion 520 may include a second photosensitive polymer 1161, and second quantum dots 1162 and second scattering particles 1163 dispersed in the second photosensitive polymer 1161.

The second quantum dots 1162 may be excited by the blue light Lb to isotropically emit the green light Lg having a wavelength longer than the wavelength of the blue light Lb. The second photosensitive polymer 1161 may include an organic material having light transmission properties.

The second scattering particles 1163 scatter the blue light Lb that is not absorbed by the second quantum dots 1162 to cause more second quantum dots 1162 to be excited, such that the color conversion efficiency may be increased. The second scattering particles 1163 may include, e.g., $TiO_2$ or metal particles. The second quantum dots 1162 may be selected from a group II-VI compound, a group III-V compound, a group IV-VI compound, a group IV element, a group IV compound, and any combinations thereof.

The transmission portion 530 may transmit the blue light Lb incident on the transmission portion 530 without converting the color of the blue light Lb. As shown in FIG. 3, the transmission portion 530 may include a third photosensitive polymer 1171 in which third scattering particles 1173 are dispersed. In an embodiment, for example, the third photosensitive polymer 1171 may include, e.g., an organic material having light transmission properties, such as a silicon resin or an epoxy resin, and the third photosensitive polymer 1171 may include a same material as the first and second photosensitive polymers 1151 and 1161. The third scattering particles 1173 may scatter and emit the blue light Lb, and may include the same material as the first and second scattering particles 1153 and 1163.

Figure 4:
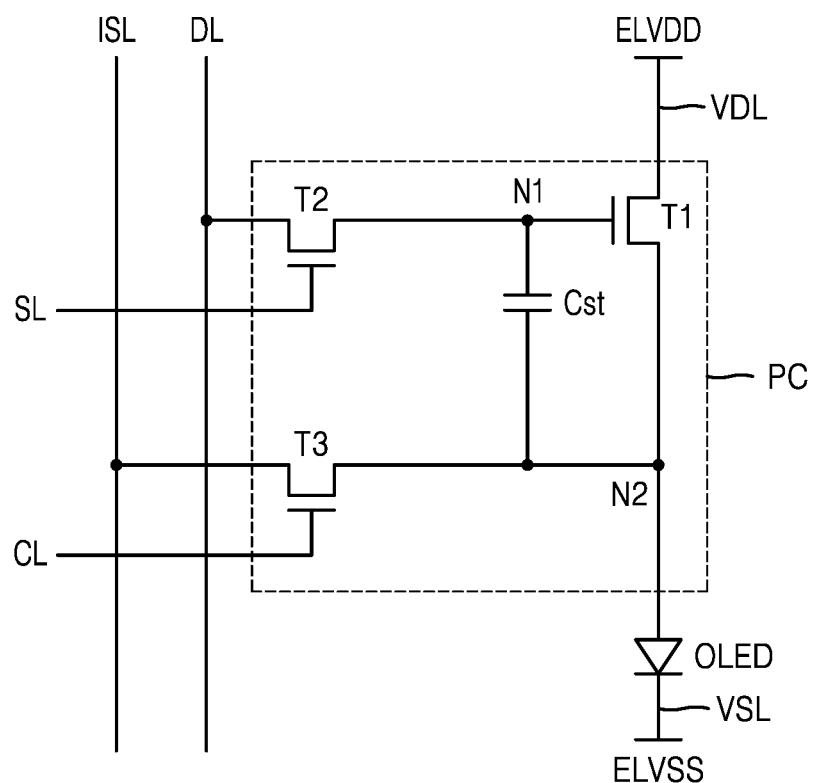
FIG. 4 is an equivalent circuit diagram of a sub-pixel circuit electrically connected to a light-emitting diode of a display apparatus, according to an embodiment.

FIG. 4 is an equivalent circuit diagram of a light-emitting diode included in a display apparatus and a sub-pixel circuit PC electrically connected to the light-emitting diode, according to an embodiment. The sub-pixel circuit PC shown in FIG. 4 may correspond to each of the first to third sub-pixel circuits PC1, PC2, and PC3 described above with reference to FIG. 2, and an organic light-emitting diode OLED may correspond to each of the first to third light-emitting diodes LED1, LED2, and LED3 described above with reference to FIG. 2.

Referring to FIG. 4, a sub-pixel electrode (e.g., an anode) of the organic light-emitting diode OLED may be connected to the sub-pixel circuit PC, and an opposite electrode (e.g., a cathode) of the organic light-emitting diode OLED may be connected to a common voltage line VSL through which a common voltage ELVSS is provided. The organic light-emitting diode OLED may emit light with a luminance corresponding to an amount of current supplied thereto from the sub-pixel circuit PC.

The sub-pixel circuit PC may be configured to control an amount of current flowing from a driving voltage line VDL to the common voltage line VSL via the organic light-emitting diode OLED. The sub-pixel circuit PC may include a first thin-film transistor T1, a second thin-film transistor T2, a third thin-film transistor T3, and a capacitor Cst.

Each of the first thin-film transistor T1, the second thin-film transistor T2, and third thin-film transistor T3 may include an oxide semiconductor transistor including a semiconductor layer including an oxide semiconductor, or may include a silicon semiconductor transistor including a semiconductor layer including polysilicon. According to a type of transistor, a first electrode may be one of a source electrode and a drain electrode, and a second electrode may be the other of the source and drain electrodes.

A first electrode of the first thin-film transistor T1 may be connected to the driving voltage line VDL through which the driving voltage ELVDD is supplied, and a second electrode thereof may be connected to a first electrode of the organic light-emitting diode OLED. A gate electrode of the first thin-film transistor T1 may be connected to a first node N1. The first thin-film transistor T1 may be configured to control an amount of current flowing from the driving voltage line VDL to the organic light-emitting diode OLED, in response to a voltage of the first node N1.

The second thin-film transistor T2 may be a switching transistor. A first electrode of the second thin-film transistor T2 may be connected to a data line DL, and a second electrode thereof may be connected to the first node N1. A gate electrode of the second thin-film transistor T2 may be connected to a scan line SL. The second thin-film transistor T2 may be turned on when a scan signal is supplied through the scan line SL, and may be configured to electrically connect the data line DL to the first node N1.

The third thin-film transistor T3 may be an initialization transistor and/or a sensing transistor. A first electrode of the third thin-film transistor T3 may be connected to a second node N2, and a second electrode thereof may be connected to a sensing line ISL. A gate electrode of the third thin-film transistor T3 may be connected to a control line CL.

The capacitor Cst may be connected between the first node N1 and the second node N2. In an embodiment, for example, one electrode of the capacitor Cst may be connected to the gate electrode of the first thin-film transistor T1, and the other electrode of the capacitor Cst may be connected to the sub-pixel electrode of the organic light-emitting diode OLED.

In FIG. 4, an embodiment where the first thin-film transistor T1, the second thin-film transistor T2, and the third thin-film transistor T3 are n-channel metal oxide semiconductor (NMOS) transistors is shown, but one or more embodiments are not limited thereto. In an alternative embodiment, for example, at least one of the first thin-film transistor T1, the second thin-film transistor T2, and the third thin-film transistor T3 may be formed as a p-channel metal oxide semiconductor (PMOS) transistor.

Although FIG. 4 illustrates an embodiment where the sub-pixel circuit PC includes three thin-film transistors and a single capacitor, one or more embodiments are not limited thereto. In an alternative embodiment, the sub-pixel circuit PC may include four or more thin-film transistors and/or two or more capacitors. In another alternative embodiment, the sub-pixel circuit PC may also include seven thin-film transistors and a single capacitor.

Figure 5:
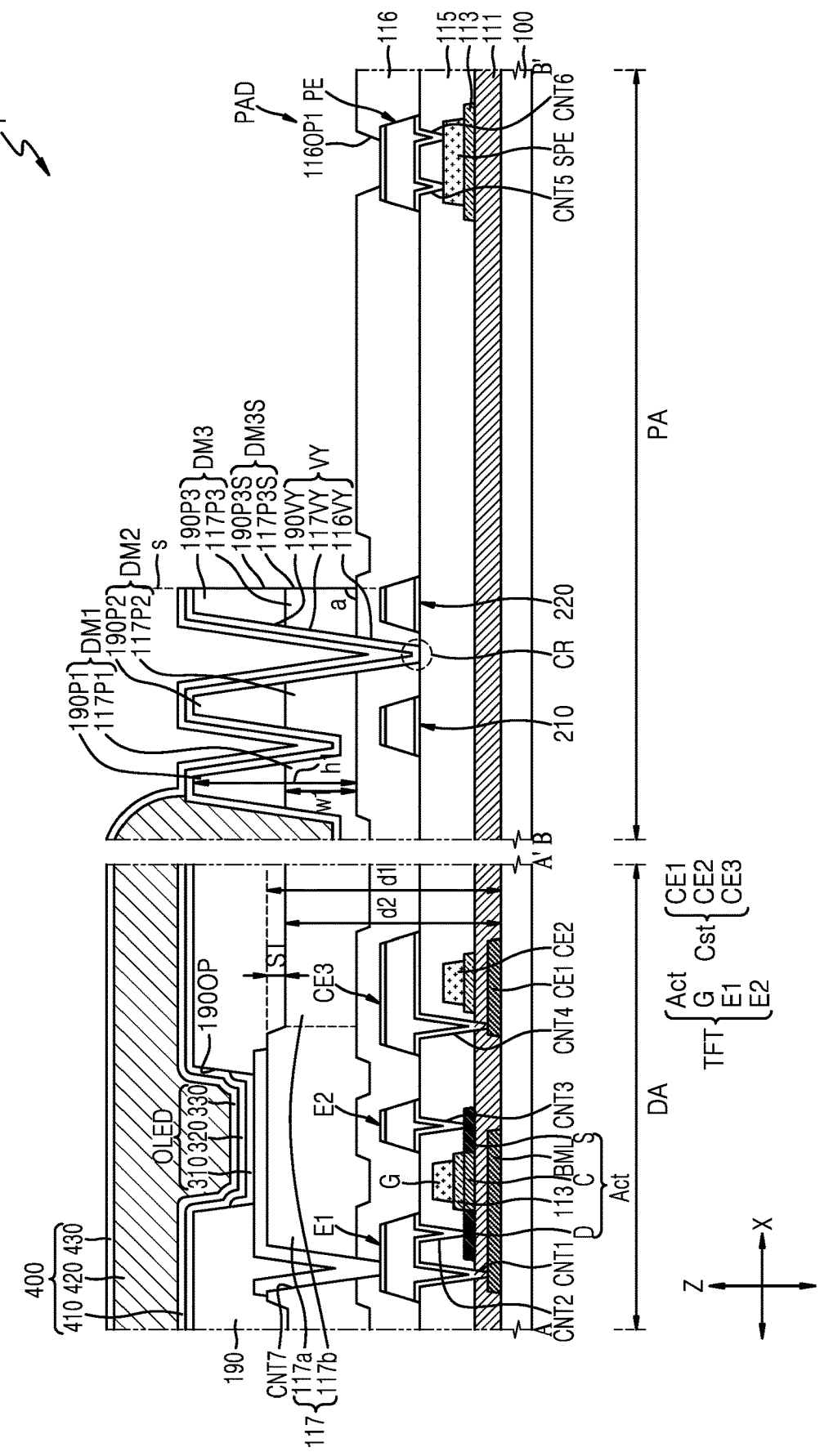
FIG. 5 is a schematic cross-sectional view of a display apparatus according to an embodiment.

FIG. 5 is a schematic diagram of the display apparatus 1, according to an embodiment, and is a cross-sectional view of lines A-A' and B-B' of FIG. 1.

Referring to a cross-section of the display apparatus 1 taken along the line A-A' in FIG. 5, an embodiment of the display apparatus 1 may include a thin-film transistor TFT and a capacitor Cst disposed on a portion of the substrate 100 corresponding to the display area DA. The thin-film transistor TFT may correspond to at least one of the first to third thin-film transistors T1, T2, and T3 described with reference to FIG. 4. The thin-film transistor TFT may include a semiconductor layer Act and a gate electrode G. The capacitor Cst may include a first capacitor electrode CE1, a second capacitor electrode CE2, and a third capacitor electrode CE3.

The substrate 100 may include a glass material, a ceramic material, a metal material, or a material that is flexible or bendable. In an embodiment where the substrate 100 is flexible or bendable, the substrate 100 may include a polymer resin, such as a polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a single-layered or multi-layered structure of the material described above, and in an embodiment where the substrate 100 has a multi-layered structure, the substrate 100 may further include an inorganic layer. In some embodiments, the substrate 100 may have a structure including an organic material, an inorganic material, and an organic material.

A buffer layer 111 may be disposed on the substrate 100 to reduce or block penetration of a foreign material, moisture, or external air from the bottom of the substrate 100 and may provide a flat surface on the substrate 100. The buffer layer 111 may include an inorganic material, such as oxide or nitride, an organic material, or an organic/inorganic composite and may have a single-layered or multi-layered structure of an inorganic material and an organic material.

A conductive layer BML and the first capacitor electrode CE1 may be between the substrate 100 and the buffer layer 111. The conductive layer BML may overlap the semiconductor layer Act. Hereinafter, an expression "one element overlaps another element" means the one element overlaps the another element in a thickness direction of the substrate 100 or the Z direction. In an embodiment, where the semiconductor layer Act includes an oxide semiconductor material, the semiconductor layer Act is vulnerable to light. In such an embodiment, the conductive layer BML may effectively prevent external light incident from the substrate 100 from reaching the semiconductor layer Act.

The conductive layer BML and the first capacitor electrode CE1 may each include a conductive material including molybdenum (Mo), aluminum (Al), copper (Cu), and titanium (Ti) and include a single layer or multi-layer including the above conductive material.

The semiconductor layer Act may be disposed on the buffer layer 111. In an embodiment, the semiconductor layer Act may include an oxide semiconductor material. In FIG. 5, an embodiment where the semiconductor layer Act includes an oxide semiconductor is shown, but in some embodiments, the semiconductor layer Act may include amorphous silicon or polysilicon. Hereinafter, for convenience of description, embodiments where the semiconductor layer Act is an oxide semiconductor will be described, but not being limited thereto.

The semiconductor layer Act may include least one material selected from indium (In), gallium (Ga), stannum (Sn), zirconium (Zr), vanadium (V), hafnium (Hf), cadmium (Cd), germanium (Ge), chromium (Cr), Ti, Al, cesium (Cs), cerium (Ce), and zinc (Zn). In an embodiment, for example, the semiconductor layer Act may include an InSnZnO (ITZO) semiconductor layer or an InGaZnO (IGZO) semiconductor layer. Because an oxide semiconductor has a wide band gap, high carrier mobility, and low leakage current, a voltage drop is not large even when a driving time is long. Accordingly, in such an embodiment, a luminance change due to a voltage drop is not large even during low-frequency operation.

The semiconductor layer Act may include a channel region C, and a source region S and a drain region D arranged on opposing sides of the channel region C.

A gate insulating layer 113 may be disposed on the semiconductor layer Act. The gate insulating layer 113 may include silicon oxide, silicon nitride, silicon oxynitride, aluminum oxide, titanium oxide, tantalum oxide, hafnium oxide, or zinc oxide.

The gate insulating layer 113 may be patterned to overlap a portion of the semiconductor layer Act. A portion of the semiconductor layer Act overlapping the gate insulating layer 113 may be the channel region C. The gate insulating layer 113 may be patterned to expose the source region S and the drain region D.

The source region S and the drain region D may be subjected to a conductorization process such as plasma treatment, and in this case, a portion of the semiconductor layer Act overlapping the gate insulating layer 113 (i.e., the channel region C) is not exposed to the plasma treatment and thus has different properties from those of the source region S and the drain region D. That is, by using the gate electrode G positioned over the gate insulating layer 113 as a self-alignment mask during the plasma treatment of the semiconductor layer Act, the channel region C that is not subjected to the plasma treatment may be formed at a position overlapping the gate insulating layer 113, and the source region S and the drain region D that are subjected to the plasma treatment may be respectively formed on opposing sides of the channel region C.

In an alternative embodiment, the gate insulating layer 113 may not be patterned to overlap a portion of the semiconductor layer Act, and may be arranged on an entire surface of the substrate 100 to cover the semiconductor layer Act.

The gate electrode G and the second capacitor electrode CE2 of the capacitor Cst may be disposed on the gate insulating layer 113. The gate electrode G may overlap the channel region C of the semiconductor layer Act. The second capacitor electrode CE2 of the capacitor Cst may overlap the first capacitor electrode CE1 with the buffer layer 111 and/or the gate insulating layer 113 therebetween, and may form a capacitance.

The gate electrode G and the second capacitor electrode CE2 may have a single layer or multi-layer structure including at least one metal selected from among, e.g., Al, platinum (Pt), palladium (Pd), silver (Ag), magnesium (Mg), gold (Au), nickel (Ni), neodymium (Nd), iridium (Ir), Cr, lithium (Li), calcium (Ca), Mo, Ti, tungsten (W), and Cu.

An interlayer insulating layer 115 may be arranged to cover the semiconductor layer Act, the gate electrode G, and the second capacitor electrode CE2. The interlayer insulating layer 115 may include one or more inorganic insulating materials. The inorganic insulating material may include silicon oxide, silicon nitride, silicon oxynitride, aluminum oxide, titanium oxide, tantalum oxide, hafnium oxide, or zinc oxide.

A first electrode E1, a second electrode E2, and the third capacitor electrode CE3 of the capacitor Cst may be disposed on the interlayer insulating layer 115. The first electrode E1 and the second electrode E2 may each be a source electrode or a drain electrode. In an embodiment, for example, the first electrode E1 may be a drain electrode, and the second electrode E2 may be a source electrode. The third capacitor electrode CE3 of the capacitor Cst may overlap the second capacitor electrode CE2 with the interlayer insulating layer 115 therebetween, and may form a capacitance. In this case, the interlayer insulating layer 115 may function as a dielectric layer of the capacitor Cst.

The first electrode E1, the second electrode E2, and the third capacitor electrode CE3 may each have a single layer or multi-layer structure including at least one metal selected from among, e.g., Al, Pt, Pd, Ag, Mg, Au, Ni, Nd, Ir, Cr, Li, Ca, Mo, Ti, W, and Cu. In an embodiment, for example, as shown in FIG. 5, the first electrode E1, the second electrode E2, and the third capacitor electrode CE3 may each have a triple-layered structure of Ti/Al/Ti.

The first electrode E1 and the second electrode E2 may be respectively connected to the source region S or the drain region D of the semiconductor layer Act through a contact hole. In an embodiment, for example, the first electrode E1 may be connected to the drain region D of the semiconductor layer Act through a second contact hole CNT2 defined or formed through the interlayer insulating layer 115. The second electrode E2 may be connected to the source region S of the semiconductor layer Act through a third contact hole CNT3 defined or formed through the interlayer insulating layer 115.

The first electrode E1 and be connected to the conductive layer BML through a first contact hole CNT1 defined or formed through the buffer layer 111 and the interlayer insulating layer 115. The conductive layer BML may be electrically connected to the drain region D of the semiconductor layer Act through the first electrode E1.

In an embodiment, the capacitor Cst may include the first capacitor electrode CE1, the second capacitor electrode CE2, and the third capacitor electrode CE3. The first capacitor electrode CE1, the second capacitor electrode CE2, and the third capacitor electrode CE3 may overlap each other. The third capacitor electrode CE3 may be electrically connected to the first capacitor electrode CE1. In an embodiment, for example, the third capacitor electrode CE3 may be connected to the first capacitor electrode CE1 through a fourth contact hole CNT4 defined or formed through the buffer layer 111 and the interlayer insulating layer 115.

In an embodiment, as shown in FIG. 5, the capacitor Cst may not overlap and be present separately from the thin-film transistor TFT. However, one or more embodiments are not limited thereto. In an alternative embodiment, the capacitor Cst may overlap the thin-film transistor TFT. In an embodiment, for example, the second capacitor electrode CE2 of the capacitor Cst may be integrally formed as a single unitary and indivisible body with the gate electrode G of the thin-film transistor TFT. The third capacitor electrode CE3 of the capacitor Cst may be integrally formed as a single unitary and indivisible body with the second electrode E2 of the thin-film transistor TFT.

An inorganic insulating layer 116, which is a first insulating layer, may be provided to cover the first electrode E1, the second electrode E2, and the third capacitor electrode CE3. The inorganic insulating layer 116 may include at least one inorganic insulating material, and the inorganic insulating material may include silicon oxide, silicon nitride, silicon oxynitride, aluminum oxide, titanium oxide, tantalum oxide, hafnium oxide, or zinc oxide. The inorganic insulating layer 116 may have a single layer or multi-layer structure including at least one selected from the aforementioned inorganic insulating materials.

A planarization layer 117, which is a second insulating layer, may be disposed on the inorganic insulating layer 116. The inorganic insulating layer 116 and the planarization layer 117 may be provided with a seventh contact hole CNT7 defined therethrough for connecting the thin-film transistor TFT to a sub-pixel electrode 310. The organic light-emitting diode OLED may be disposed on the planarization layer 117. The organic light-emitting diode OLED may include the sub-pixel electrode 310, an emission layer 320, and an opposite electrode 330 facing the sub-pixel electrode 310.

The planarization layer 117 may have a single layer or multi-layer structure including an organic material. The planarization layer 117 may include a general-purpose polymer, such as benzocyclobutene (BCB), polyimide, hexamethyldisiloxane (HMDSO), poly(methyl methacrylate) (PMMA), or polystyrene (PS), a polymer derivative having a phenol-based group, an acrylic polymer, an imide-based polymer, an aryl-ether-based polymer, an amide-based polymer, a fluorine-based polymer, a p-xylene-based polymer, a vinyl alcohol-based polymer, or any blends thereof. The planarization layer 117 may have a single layer or multi-layer structure including at least one selected from the above materials.

The planarization layer 117 may include a first portion 117a disposed on the thin-film transistor TFT, and a second portion 117b extending from the first portion 117a. In an embodiment, an upper surface of the planarization layer 117 may have a step (or define a stepped structure) ST between the first portion 117a and the second portion 117b. That is, a vertical distance d1 from an upper surface of the substrate 100 to an upper surface of the first portion 117a may be greater than a vertical distance d2 from the upper surface of the substrate 100 to an upper surface of the second portion 117b.

The sub-pixel electrode 310 may be connected to the first electrode E1 through the seventh contact hole CNT7. The sub-pixel electrode 310 may include a (semi-)transmissive electrode or a reflective electrode. In some embodiments, the sub-pixel electrode 310 may include a reflective layer including Ag, Mg, Al, Pt, Pd, Au, Ni, Nd, Ir, Cr, or any compounds thereof, and a transparent or semi-transparent electrode layer formed on the reflective layer. The sub-pixel electrode 310 may include a transparent or semi-transparent electrode layer including indium tin oxide (ITO), indium zinc oxide (IZO), zinc oxide (ZnO), indium oxide ($In_2O_3$), indium gallium oxide (IGO), or aluminum zinc oxide (AZO). The sub-pixel electrode 310 may be defined by a single layer, a double layer, or three or more layers.

In an embodiment, the sub-pixel electrode 310 may be arranged to overlap only the first portion 117a of the planarization layer 117. As shown in FIG. 5, a step ST may also be formed between the first portion 117a and the second portion 117b of the planarization layer 117 extending toward the display area DA, as well as between the first portion 117a and the second portion 117b extending toward the peripheral area PA. That is, the first portion 117a corresponds to a portion of the planarization layer 117 in which a vertical distance from the substrate 100 to the upper surface of the planarization layer 117 is relatively long, and the sub-pixel electrode 310 may be arranged over the first portion 117a.

A bank layer 190 may be disposed on the planarization layer 117. The bank layer 190 may cover an edge of the sub-pixel electrode 310 and be provided with an opening 190OP that exposes a middle portion of the sub-pixel electrode 310. The bank layer 190 may prevent an arc or the like from occurring on the edge of the sub-pixel electrode 310 by increasing a distance between the edge of the sub-pixel electrode 310 and the opposite electrode 330.

The bank layer 190 may include at least one organic insulating material selected from polyimide, polyamide, an acryl resin, BCB, and a phenolic resin.

In an embodiment, because the step ST is formed between the first portion 117a and the second portion 117b of the planarization layer 117, a large amount of material for forming the bank layer 190 may be used to form the bank layer 190 covering the edge of the sub-pixel electrode 310 to a sufficient thickness. Also, when compared to a case in which the planarization layer 117 does not have the step ST, the bank layer 190 does not sufficiently cover the edge of the sub-pixel electrode 310, and accordingly, a possibility of occurrence of a dark spot defect in the organic light-emitting diode OLED, which is a light-emitting element, caused by the sub-pixel electrode 310 being in contact with the opposite electrode 330 arranged over the sub-pixel electrode 310 may increase.

However, in an embodiment, the step ST between the first portion 117a and the second portion 117b of the planarization layer 117 may be formed relatively small (or to be less than a predetermined height difference) through a manufacturing method to be described below. When compared to a case in which the step ST between the first portion 117a and the second portion 117b of the planarization layer 117 is large, the amount of material for forming the bank layer 190 may be relatively reduced, and the rate of occurrence of a defect in the organic light-emitting diode OLED, which occurs due to the bank layer 190 not being able to sufficiently cover the edge of the sub-pixel electrode 310 may be reduced.

The emission layer 320 may be disposed on the sub-pixel electrode 310. The emission layer 320 may overlap the opening 190OP of the bank layer 190. The emission layer 320 may include a low molecular weight material or a polymer material, and may emit red light, green light, blue light, or white light. In an embodiment, the emission layer 320 may be patterned to correspond to each of a plurality of sub-pixel electrodes 310. In some embodiments, the emission layer 320 may be integrally formed as a single unitary and indivisible body across the plurality of sub-pixel electrodes 310.

In some embodiments, a hole injection layer (HIL) and/or a hole transport layer (HTL) may be between the sub-pixel electrode 310 and the emission layer 320.

The opposite electrode 330 may be disposed on the emission layer 320. The opposite electrode 330 may include a conductive material having a small work function. In an embodiment, for example, the opposite electrode 330 may include a (semi-)transparent layer including Ag, Mg, Al, Pt, Pd, Au, Ni, Nd, Ir, Cr, Li, Ca, or any alloys thereof. Alternatively, the opposite electrode 330 may further include a layer including ITO, IZO, ZnO, or $In_2O_3$ on the (semi-)transparent layer including the aforementioned material. In an embodiment, the opposite electrode 330 may be arranged to entirely cover the display area DA.

In some embodiments, an electron transport layer (ETL) and/or an electron injection layer (EIL) may be between the emission layer 320 and the opposite electrode 330.

Because the organic light-emitting diode OLED described above may be easily damaged by moisture or oxygen from the outside, the encapsulation layer 400 may be arranged to cover the organic light-emitting diode OLED, thereby protecting the organic light-emitting diode OLED. The encapsulation layer 400 may include at least one organic encapsulation layer and at least one inorganic encapsulation layer. In an embodiment, for example, the encapsulation layer 400 may include first and second inorganic encapsulation layers 410 and 430, and an organic encapsulation layer 420 therebetween.

Each of the first and second inorganic encapsulation layers 410 and 430 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The organic encapsulation layer 420 may include a polymer-based material. The polymer-based material may include an acrylic resin, an epoxy-based resin, polyimide, and polyethylene. In an embodiment, for example, the organic encapsulation layer 420 may include an acrylic resin, such as polymethyl methacrylate and polyacrylic acid.

Referring to a cross-section of the display apparatus 1 taken along line B-B' of FIG. 5, an embodiment of the display apparatus 1 may include a first wire 210, a second wire 220, and a pad portion PAD, which are disposed on a portion of the substrate 100 corresponding to the peripheral area PA. The pad portion PAD may include an auxiliary pad electrode SPE and a pad electrode PE.

The buffer layer 111 may extend from the display area DA to the peripheral area PA. The gate insulating layer 113 may be disposed on the buffer layer 111. In an embodiment, the gate insulating layer 113 may be patterned by using the auxiliary pad electrode SPE as a self-align mask, where the auxiliary pad electrode SPE is disposed on the gate insulating layer 113.

The auxiliary pad electrode SPE may be arranged in (or directly on) a same layer and include a same material as the gate electrode G and the second capacitor electrode CE2 of the capacitor Cst. In an embodiment, for example, the auxiliary pad electrode SPE may be disposed on the gate insulating layer 113. The auxiliary pad electrode SPE may include a single layer or multi-layer of at least one metal selected from Al, Pt, Pd, Ag, Mg, Au, Ni, Nd, Ir, Cr, Li, Ca, Mo, Ti, W, and Cu.

The interlayer insulating layer 115 may be disposed on the auxiliary pad electrode SPE. The interlayer insulating layer 115 may extend from the display area DA to the peripheral area PA. The first wire 210, the second wire 220, and the pad electrode PE may be disposed on the interlayer insulating layer 115. The first wire 210 and the second wire 220 may be one of a power supply line and a signal wire, such as a data line.

The first wire 210, the second wire 220, and the pad electrode PE may be arranged in a same layer and include a same material as the first electrode E1, the second electrode E2, and the third capacitor electrode CE3 of the capacitor Cst, respectively. The first wire 210, the second wire 220, and the pad electrode PE may be disposed on the interlayer insulating layer 115. The first wire 210, the second wire 220, and pad electrode PE may each have a single layer or multi-layer structure including at least one metal selected from, e.g., Al, Pt, Pd, Ag, Mg, Au, Ni, Nd, Ir, Cr, Li, Ca, Mo, Ti, W, and Cu. In an embodiment, for example, the first wire 210, the second wire 220, and the pad electrode PE may each have a triple-layered structure of Ti/Al/Ti.

The pad electrode PE may overlap the auxiliary pad electrode SPE. The pad electrode PE may be connected to the auxiliary pad electrode SPE through a fifth contact hole CNT5 and a sixth contact hole CNT6, which are defined or formed in the interlayer insulating layer 115. In FIG. 5, an embodiment where two contact holes are defined to connect the pad electrode PE to the auxiliary pad electrode SPE, but in an alternative embodiment, more or fewer contact holes may be used. Also, in some embodiments, the auxiliary pad electrode SPE may be omitted.

The inorganic insulating layer 116 may be disposed on the first wire 210, the second wire 220, and the pad electrode PE. The inorganic insulating layer 116 may extend from the display area DA to the peripheral area PA. The inorganic insulating layer 116 may expose at least a portion of the pad portion PAD. In an embodiment, for example, a first opening 116OP1 of the inorganic insulating layer 116 may expose a portion of the pad electrode PE.

Also, the planarization layer 117 may expose the pad portion PAD. The planarization layer 117 may be provided with an opening corresponding to at least a portion of the peripheral area PA, and may not overlap the pad portion PAD. As a comparative example, when a planarization layer is arranged in an outer portion of a display panel, the planarization layer may function as a moisture permeation path from the outside and cause deterioration of a light-emitting element. The pad portion PAD exposed without being covered by the inorganic insulating layer 116 and the planarization layer 117 may be electrically connected to a flexible printed circuit board.

A first dam portion DM1, a second dam portion DM2, and a third dam portion DM3 may be disposed on the inorganic insulating layer 116. In an embodiment, the third dam portion DM3 may be a mask support. The first dam portion DM1, the second dam portion DM2, and the third dam portion DM3 may be between the display area DA and the pad portion PAD. The second dam portion DM2 may be between the first dam portion DM1 and the pad portion PAD. The third dam portion DM3 may be between the second dam portion DM2 and the pad portion PAD. The first dam portion DM1 may be arranged to surround the periphery of the display area DA, on a plane. The second dam portion DM2 may be arranged to surround the first dam portion DM1, on a plane. The third dam portion DM3 may be arranged to surround the second dam portion DM2, on a plane. Although in FIG. 5 shows an embodiment where three dam portions are included, one or more embodiments are not limited thereto. In an alternative embodiment, the display apparatus 1 may include four or more dam portions.

The first dam portion DM1, the second dam portion DM2, and the third dam portion DM3 may at least partially overlap the signal wire and/or the power supply line. In an embodiment, for example, the second dam portion DM2 may overlap the first wire 210, and the third dam portion DM3 may overlap the second wire 220.

The first dam portion DM1, the second dam portion DM2, and the third dam portion DM3 may each have a multi-layered structure. In an embodiment, for example, the first dam portion DM1, the second dam portion DM2, and the third dam portion DM3 may each have a double-layered structure. A first sub-layer 117P1 of the first dam portion DM1, a first sub-layer 117P2 of the second dam portion DM2, and a first sub-layer 117P3 of the third dam portion DM3 may be defined by portions of the planarization layer 117. A second sub-layer 190P1 of the first dam portion DM1, a second sub-layer 190P2 of the second dam portion DM2, and a second sub-layer 190P3 of the third dam portion DM3 may be defined by portions of the bank layer 190. In an alternative embodiment, some of the aforementioned layers of the first dam portion DM1, the second dam portion DM2, and the third dam portion DM3 may be omitted.

In an embodiment, the inorganic insulating layer 116 may include a first valley 116VY between the second dam portion DM2 and the third dam portion DM3, where the first valley 116VY is defined through the inorganic insulating layer 116. The first valley 116VY may expose at least a portion of an upper surface of the interlayer insulating layer 115 arranged under the first valley 116VY. The first valley 116VY may be between wires disposed on the interlayer insulating layer 115. In an embodiment, for example, the first valley 116VY may be between the first wire 210 and the second wire 220. The first valley 116VY may be arranged to surround at least a portion of the display area DA, on a plane.

The planarization layer 117 may include a second valley 117VY defined through the planarization layer 117. The second valley 117VY may be between the first sub-layers 117P2 and 117P3 respectively constituting the second dam portion DM2 and the third dam portion DM3. The second valley 117VY may be an area in which a portion of the planarization layer 117 including the first sub-layers 117P1, 117P2, and 117P3 of the first to third dam portions DM1, DM2, and DM3 is removed from the peripheral area PA. The second valley 117VY may be arranged to surround at least a portion of the display area DA, on a plane.

The bank layer 190 may include a third valley 190VY defined through the bank layer 190. The third valley 190VY may be between the second sub-layers 190P2 and 190P3 respectively constituting the second dam portion DM2 and the third dam portion DM3. The third valley 190VY may be an area in which a portion of the bank layer 190 including the second sub-layers 190P1, 190P2, and 190P3 of the first to third dam portions DM1, DM2, and DM3 is removed from the peripheral area PA. The third valley 190VY may be arranged to surround at least a portion of the display area DA, on a plane.

The third valley 190VY may overlap the second valley 117VY. The second valley 117VY may overlap the first valley 116VY. An edge of the second valley 117VY and an edge of the third valley 190VY may be aligned and overlap each other. An edge of the first valley 116VY and the edge of the second valley 117VY may be aligned and overlap each other. In this case, the first valley 116VY, the second valley 117VY, and the third valley 190VY may each be an opening defined or formed in one layer, and collectively define one valley VY.

In an embodiment, the first sub-layer 117P1 of the first dam portion DM1 and the first sub-layer 117P2 of the second dam portion DM2 between the display area DA and the valley VY may be a portion extending from a portion of the planarization layer 117 arranged in the display area DA. The first sub-layer 117P1 of the first dam portion DM1 and the first sub-layer 117P2 of the second dam portion DM2 may be integrally provided or formed as a single unitary and indivisible body with a portion of the planarization layer 117 arranged in the display area DA.

The encapsulation layer 400 is arranged to cover the display area DA, and a portion of the encapsulation layer 400 may extend to the peripheral area PA. The first dam portion DM1 and the second dam portion DM2 may effectively prevent the organic encapsulation layer 420 included in the encapsulation layer 400 from overflowing toward an edge of the substrate 100.

The organic encapsulation layer 420 may be in contact with an inner surface of the first dam portion DM1 facing the display area DA. In this case, when the organic encapsulation layer 420 is in contact with the inner surface of the first dam portion DM1, it may be understood that the first inorganic encapsulation layer 410 is between the organic encapsulation layer 420 and the first dam portion DM1, and the organic encapsulation layer 420 is in direct contact with the first inorganic encapsulation layer 410.

The first inorganic encapsulation layer 410 and the second inorganic encapsulation layer 430 may be arranged over the first dam portion DM1, the second dam portion DM2, and the third dam portion DM3, and may extend toward the edge of the substrate 100. A portion of the first inorganic encapsulation layer 410 and a portion of the second inorganic encapsulation layer 430 may be in direct contact with each other on the first dam portion DM1. The first inorganic encapsulation layer 410 and the second inorganic encapsulation layer 430 may form an inorganic contact area on the first dam portion DM1.

The first inorganic encapsulation layer 410 and the second inorganic encapsulation layer 430 may be arranged along the valley VY between the second dam portion DM2 and the third dam portion DM3. A portion of the first inorganic encapsulation layer 410 may be in contact with an upper surface of the interlayer insulating layer 115 exposed by the valley VY. The portion of the first inorganic encapsulation layer 410 in contact with the interlayer insulating layer 115 may be in direct contact with a portion of the second inorganic encapsulation layer 430. The first inorganic encapsulation layer 410 may form an inorganic contact area CR while being in contact with the upper surface of the interlayer insulating layer 115 through the valley VY. In an embodiment, the display apparatus 1 includes the valley VY and the inorganic contact area CR, and thus may block penetration of moisture or foreign materials into the display area DA through the planarization layer 117 arranged in the peripheral area PA.

In an embodiment, ends of the first inorganic encapsulation layer 410 and the second inorganic encapsulation layer 430 may be between the valley VY and the pad portion PAD. In an embodiment, for example, the ends of the first inorganic encapsulation layer 410 and the second inorganic encapsulation layer 430 may be disposed on an upper surface of the third dam portion DM3. In an embodiment, the ends of the first inorganic encapsulation layer 410 and/or the second inorganic encapsulation layer 430 may be aligned with an edge of the third dam portion DM3, on a plane. The ends of the first inorganic encapsulation layer 410 and/or the second inorganic encapsulation layer 430 may be aligned with the edge of the third dam portion DM3, on a plane, and overlap each other.

As described above, the third dam portion DM3 may include the first sub-layer 117P3, and the second sub-layer 190P3 on the first sub-layer 117P3. The first sub-layer 117P3 and the second sub-layer 190P3 of the third dam portion DM3 may have a same etching surface s. As described below with reference to FIG. 6J, the first sub-layer 117P3 and the second sub-layer 190P3 of the third dam portion DM3 may be simultaneously formed by a same etching process. In an embodiment, the first sub-layer 117P3 and the second sub-layer 190P3 of the third dam portion DM3 may be formed by an etching process using the encapsulation layer 400 as a mask.

The first sub-layer 117P3 may include a first side surface 117P3S facing the pad portion PAD. The second sub-layer 190P3 may include a first side surface 190P3S facing the pad portion PAD. The first side surface 117P3S of the first sub-layer 117P3 may be positioned on a same etching surface s as the first side surface 190P3S of the second sub-layer 190P3. The first side surface 117P3S of the first sub-layer 117P3 and the first side surface 190P3S of the second sub-layer 190P3 may be formed without any step. The first side surface 117P3S of the first sub-layer 117P3 and the first side surface 190P3S of the second sub-layer 190P3 may be formed without any boundary. The first side surface 117P3S of the first sub-layer 117P3 and the first side surface 190P3S of the second sub-layer 190P3 may together correspond to a first side surface DM3S of the third dam portion DM3.

An angle a between the first side surface DM3S of the third dam portion DM3 and the upper surface of the substrate 100 may be in a range of about 85° to about 90°. The angle a between the first side surface DM3S of the third dam portion DM3 and the upper surface of the substrate 100 may be about 90°. The first side surface DM3S of the third dam portion DM3 may be nearly perpendicular to the upper surface of the substrate 100.

FIGS. 6A to 6L are cross-sectional views of a method of manufacturing a display apparatus, according to an embodiment. In detail, FIGS. 6A to 6L are cross-sectional views sequentially illustrating processes of a method of manufacturing a display apparatus, according to an embodiment, based on FIG. 5. In FIGS. 6A to 6L, the same elements as those in FIG. 5 are denoted by the same reference numerals, and thus any repeated detailed description thereof will be omitted.

Figure 6A:
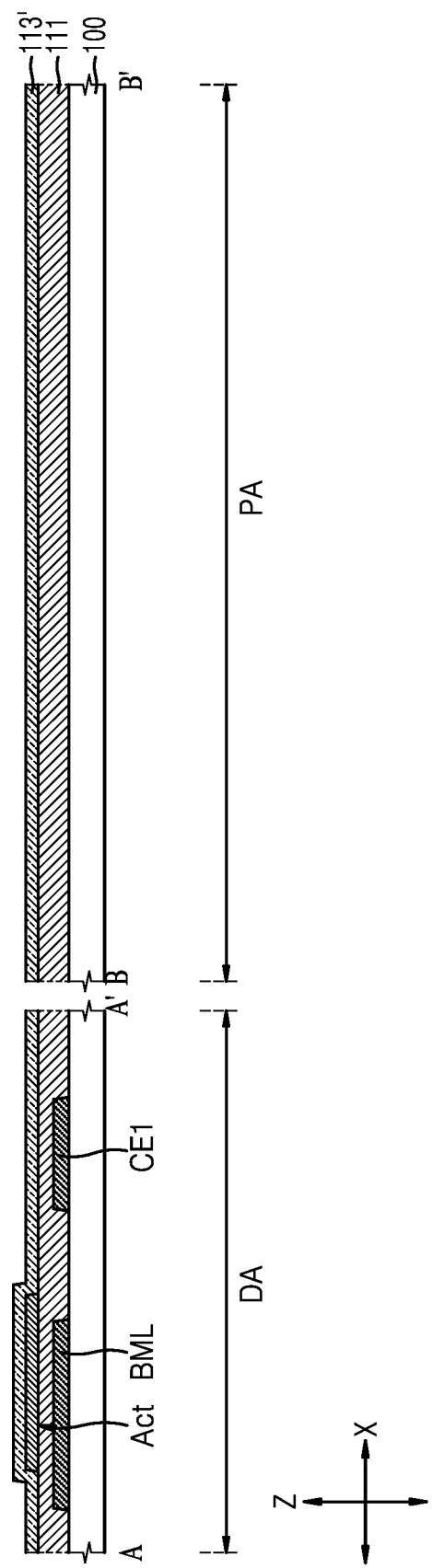

Referring to FIG. 6A, in an embodiment of a method of manufacturing a display apparatus, the conductive layer BML and the first capacitor electrode CE1 of the capacitor Cst may be formed on the substrate 100. The conductive layer BML and the first capacitor electrode CE1 may be formed by patterning a preliminary conductive layer (not shown) formed on the substrate 100. A photolithography process may be used to pattern the preliminary conductive layer (not shown). In an embodiment, a photoresist pattern (not shown) may be formed by exposing and developing a photoresist layer (not shown) on the preliminary conductive layer by using a first mask. Photoresist may be positive or negative. The conductive layer BML and the first capacitor electrode CE1 may be formed by etching the preliminary conductive layer using the photoresist pattern as an etching mask and removing the photoresist pattern.

The buffer layer 111 may be formed on the substrate 100 to cover the conductive layer BML and the first capacitor electrode CE1. The buffer layer 111 may be formed by using, e.g., a deposition method, such as chemical vapor deposition (CVD), thermochemical vapor deposition (TCVD), plasma deposition (e.g., plasma-enhanced chemical vapor deposition (PECVD)), sputtering, or electron beam (e-beam) evaporation.

The semiconductor layer Act may be formed on the buffer layer 111. The semiconductor layer Act may be formed by patterning a preliminary semiconductor layer (not shown) formed on the buffer layer 111. In the forming of the semiconductor layer Act, a second mask including a pattern corresponding to the semiconductor layer Act may be used, and a photolithography process may be used. The preliminary semiconductor layer may be formed as an oxide semiconductor and may be deposited by using, e.g., CVD.

Figure 6B:
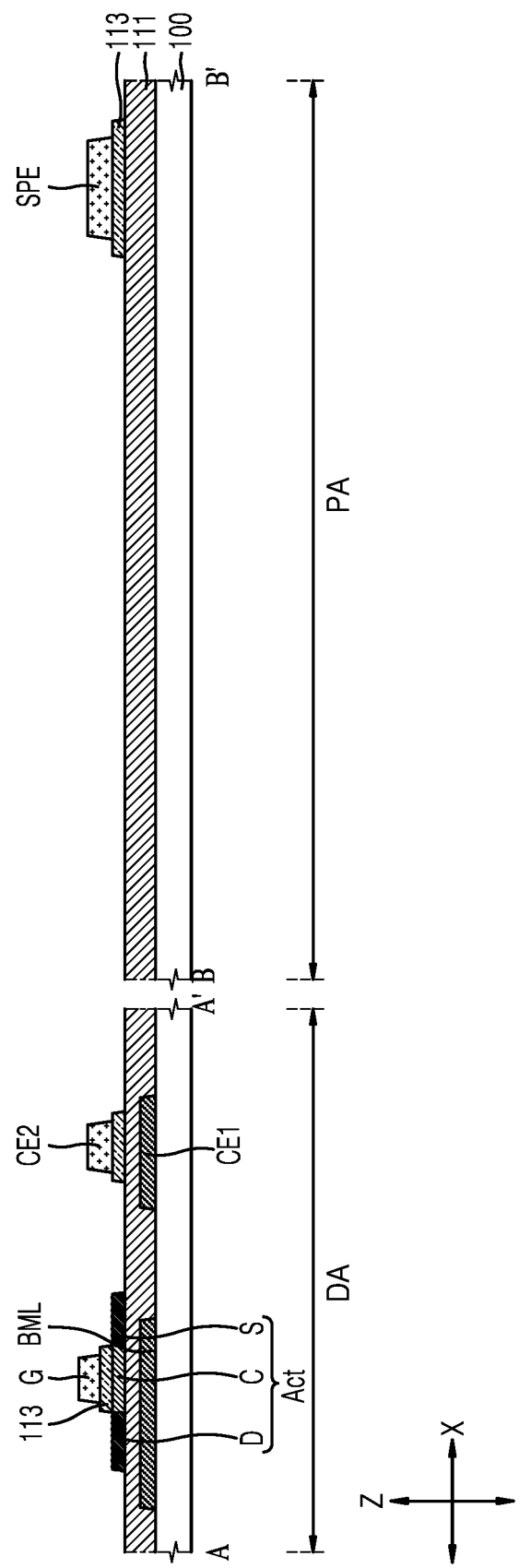

Referring to FIGS. 6A and 6B, the gate insulating layer 113 may be formed on the semiconductor layer Act. The gate electrode G, the second capacitor electrode CE2 of the capacitor Cst, and the auxiliary pad electrode SPE may be formed on the gate insulating layer 113.

The gate insulating layer 113 may be formed by patterning a preliminary gate insulating layer 113'. The gate electrode G, the second capacitor electrode CE2, and the auxiliary pad electrode SPE may be formed by patterning a preliminary metal layer (not shown) formed on the buffer layer 111 to cover the semiconductor layer Act. The gate electrode G, the second capacitor electrode CE2, and the auxiliary pad electrode SPE may be formed by patterning the preliminary metal layer using a gate photoresist pattern (not shown). The gate photoresist pattern may be formed through a third mask.

The preliminary gate insulating layer may be formed by using, e.g., a deposition method, such as CVD, TCVD, PECVD, sputtering, or e-beam evaporation.

The preliminary metal layer may include a single conductive layer or a plurality of conductive layers. The preliminary metal layer may be disposed on the preliminary gate insulating layer and may be formed by using, e.g., a deposition method, such as CVD, PECVD, low pressure chemical vapor deposition, physical vapor deposition, sputtering, or atomic layer deposition.

The gate insulating layer 113 may be formed by forming the gate electrode G, the second capacitor electrode CE2, and the auxiliary pad electrode SPE on the preliminary gate insulating layer, and then patterning the preliminary gate insulating layer using the gate photoresist pattern defined by the gate electrode G, the second capacitor electrode CE2, and the auxiliary pad electrode SPE as an etching mask without using a separate mask. An etching process of patterning the gate insulating layer 113 may include, e.g., dry etching. A portion of the semiconductor layer Act exposed without overlapping the gate electrode G may be conductorized by plasma treatment. The conductorized portion may correspond to the source region S and the drain region D. The channel region C overlapping the gate electrode G may have different properties from those of the source region S and the drain region D.

Referring to FIG. 6C, the interlayer insulating layer 115 may be formed on the buffer layer 111 to cover the gate electrode G, the second capacitor electrode CE2, and the auxiliary pad electrode SPE. The interlayer insulating layer 115 may be formed by using, e.g., a deposition method, such as CVD, TCVD, PECVD, sputtering, or e-beam evaporation.

Thereafter, first to sixth contact holes CNT1, CNT2, CNT3, CNT4, CNT5, and CNT6 passing through the buffer layer 111 and/or the interlayer insulating layer 115 may be formed, that is, the first to sixth contact holes CNT1, CNT2, CNT3, CNT4, CNT5, and CNT6 may be formed through the buffer layer 111 and/or the interlayer insulating layer 115. In the forming of the first to sixth contact holes CNT1, CNT2, CNT3, CNT4, CNT5, and CNT6, a fourth mask having a pattern corresponding to each contact hole may be used, and a photolithography process may be used. The buffer layer 111 and/or the interlayer insulating layer 115 may be partially removed by using, as an etching mask, a photoresist pattern (not shown) formed by using the fourth mask.

The first electrode E1, the second electrode E2, the third capacitor electrode CE3 of the capacitor Cst, the first wire 210, the second wire 220, and the pad electrode PE may be formed on the interlayer insulating layer 115. The first electrode E1, the second electrode E2, the third capacitor electrode CE3, the first wire 210, the second wire 220, and the pad electrode PE may be formed by patterning a preliminary electrode layer (not shown) formed on the interlayer insulating layer 115. For the first electrode E1, the second electrode E2, the third capacitor electrode CE3, the first wire 210, the second wire 220, and the pad electrode PE, a fifth mask having a mask corresponding to each of the elements may be used, and a photolithography process may be used.

The preliminary electrode layer may be defined by a single conductive layer or a plurality of conductive layers. In an embodiment, for example, the preliminary electrode layer may include a triple layer of Ti/Al/Ti. The preliminary electrode layer may be formed by using, e.g., a deposition layer, such as CVD, PECVD, low pressure chemical vapor deposition, physical vapor deposition, sputtering, or atomic layer deposition.

The inorganic insulating layer 116 may be formed on the interlayer insulating layer 115 to cover the first electrode E1, the second electrode E2, the third capacitor electrode CE3 of the capacitor Cst, the first wire 210, the second wire 220, and the pad electrode PE. The inorganic insulating layer 116 may be formed by using, e.g., a deposition method, such as CVD, TCVD, PECVD, sputtering, or e-beam evaporation.

Figure 6D:
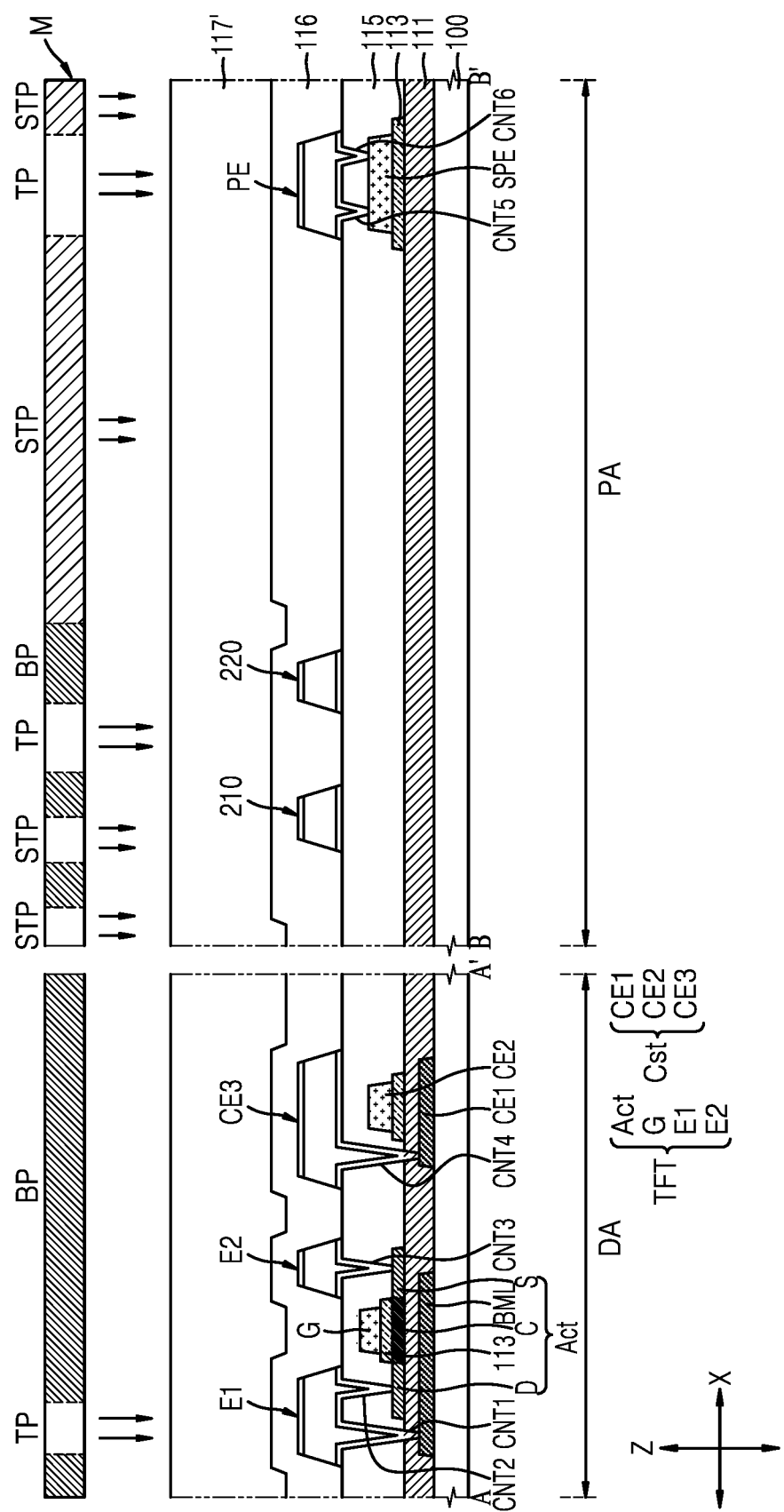

Referring to FIG. 6D, a preliminary planarization layer 117' may be formed on the inorganic insulating layer 116. In forming of the planarization layer 117 using the preliminary planarization layer 117', a sixth mask M may be used, and a photolithography process may be used. In an embodiment, for example, the planarization layer 117 may be used by applying the preliminary planarization layer 117', exposing the preliminary planarization layer 117' using the sixth mask M, and then developing the preliminary planarization layer 117'. The preliminary planarization layer 117' may be formed in the display area DA and the peripheral area PA.

Figure 6E:
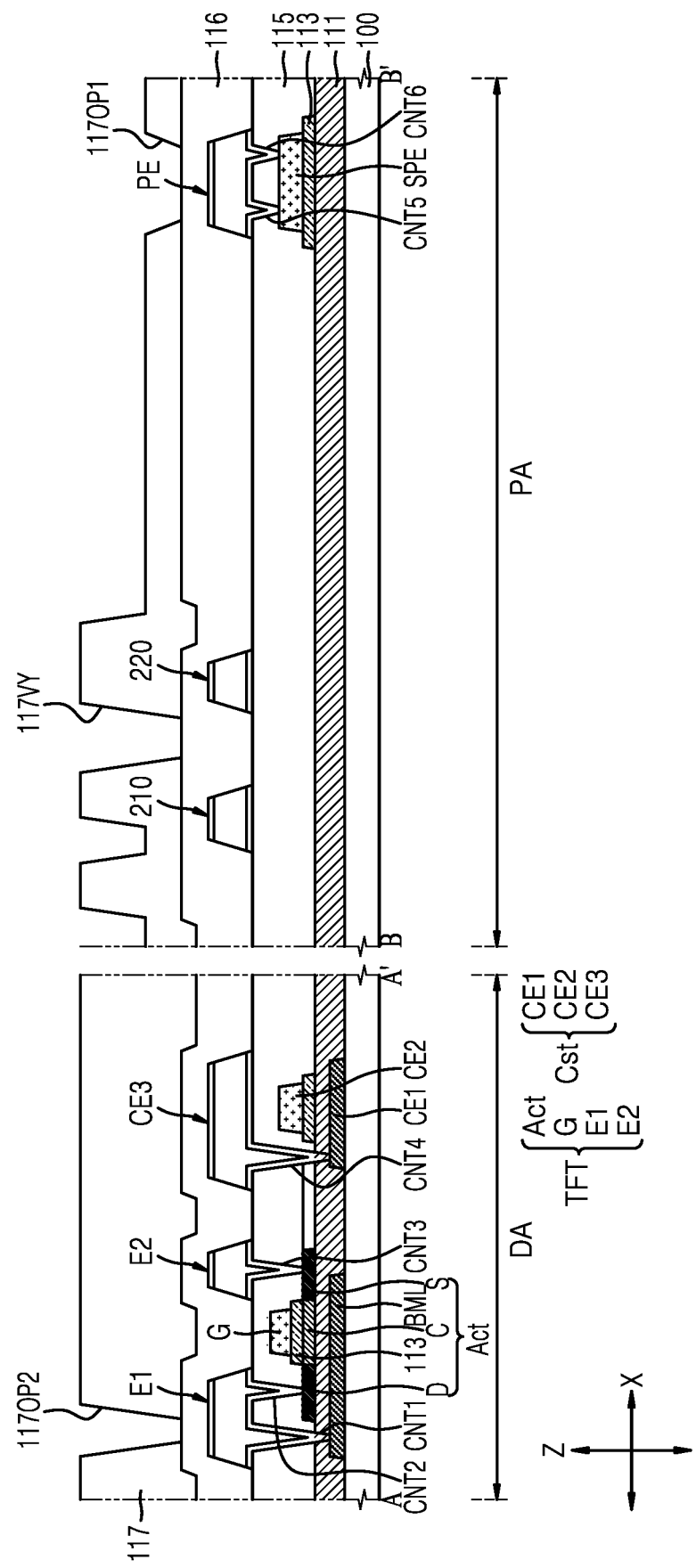

In an embodiment, the preliminary planarization layer 117' may include, e.g., a positive photoresist. FIGS. 6D and 6E show, as an example, that the preliminary planarization layer 117' includes the positive photoresist, but the preliminary planarization layer 117' may include a negative photoresist. In this case, in contrast with a case in which the preliminary planarization layer 117' includes the positive photoresist, an exposed area of the preliminary planarization layer 117' remains after a development process, and a thickness of a remaining portion of the planarization layer 117 may increase as an amount of exposure being applied increases.

In an embodiment, the sixth mask M may include a half-tone mask. The sixth mask M may include a light-blocking portion BP, a semi-transmissive portion STP, and a transmissive portion TP. The light-blocking portion BP may not pass most of light. The semi-transmissive portion STP may pass some of the light. A light transmittance of the semi-transmissive portion STP may be higher than a light transmittance of the light-blocking portion BP. A light transmittance of the transmissive portion TP may be higher than the light transmittance of the semi-transmissive portion STP. The light-blocking portion BP, the semi-transmissive portion STP, and the transmissive portion TP may each be provided in plural.

Through the sixth mask M, the preliminary planarization layer 117' may be exposed with different amounts of exposure for each portion, and a portion of the preliminary planarization layer 117' may be removed through a development process. Because an amount of the preliminary planarization layer 117' being removed is different according to an amount of exposure, the patterned planarization layer 117 having a different thickness for each portion may be formed at once.

Referring to FIGS. 6D and 6E, a portion of the planarization layer 117 exposed by the semi-transmissive portion STP of the sixth mask M may be formed with a thickness less than that of a portion of the planarization layer 117 exposed by the light-blocking portion BP of the sixth mask M. The planarization layer 117 may be provided with a first opening 117OP1 overlapping the pad electrode PE, a second opening 117OP2 overlapping the first electrode E1 or the second electrode E2, and the second valley 117VY, to correspond to the portion of the planarization layer 117 exposed by the transmissive portion TP of the sixth mask M.

The first opening 117OP1, the second opening 117OP2, and the second valley 117VY may each expose a portion of the inorganic insulating layer 116.

Figure 6F:
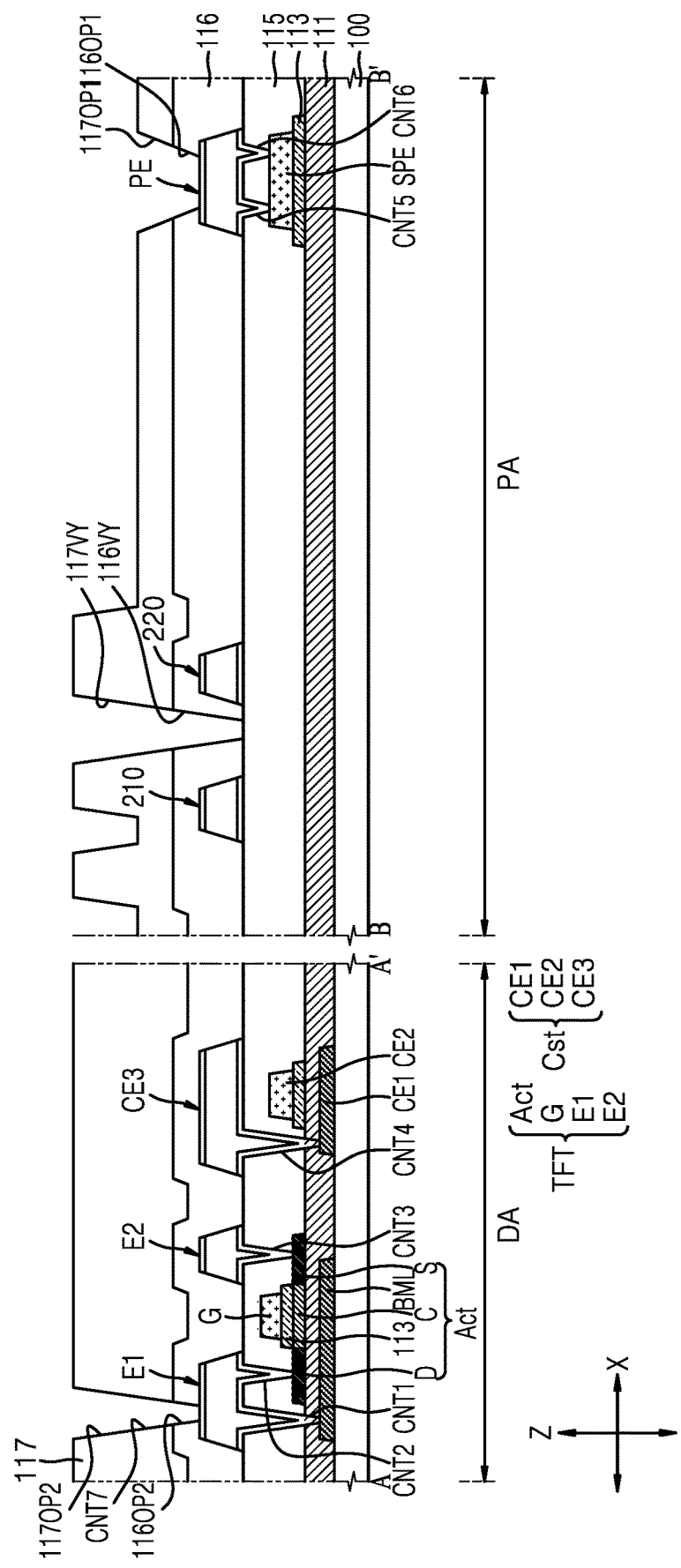

Referring to FIG. 6F, the inorganic insulating layer 116 may be etched by using the patterned planarization layer 117 as an etching mask. In this case, the etching may include, e.g., dry etching. In an etching process, a portion of the inorganic insulating layer 116 is removed, and accordingly, the first opening 116OP1 and a second opening 116OP2 of the inorganic insulating layer 116 may be formed. The first opening 116OP1 of the inorganic insulating layer 116 may overlap the first opening 117OP1 of the planarization layer 117. The first opening 116OP1 of the inorganic insulating layer 116 may expose the pad electrode PE. The second opening 116OP2 of the inorganic insulating layer 116 may overlap the second opening 117OP2 of the planarization layer 117. The first opening 116OP1 of the inorganic insulating layer 116 may expose the first electrode E1 or the second electrode E2. The second opening 116OP2 of the inorganic insulating layer 116 and the second opening 117OP2 of the planarization layer 117 may constitute the seventh contact hole CNT7.

Also, a portion of the inorganic insulating layer 116 is removed, and accordingly, the first valley 116VY of the inorganic insulating layer 116 may be formed. The first valley 116VY of the inorganic insulating layer 116 may overlap the second valley 117VY of the planarization layer 117. The first valley 116VY of the inorganic insulating layer 116 may expose the interlayer insulating layer 115. In some embodiments, when a portion of the inorganic insulating layer 116 is removed, a portion of the planarization layer 117 is removed together, such that an overall thickness of the planarization layer 117 may also be reduced.

Figure 6G:
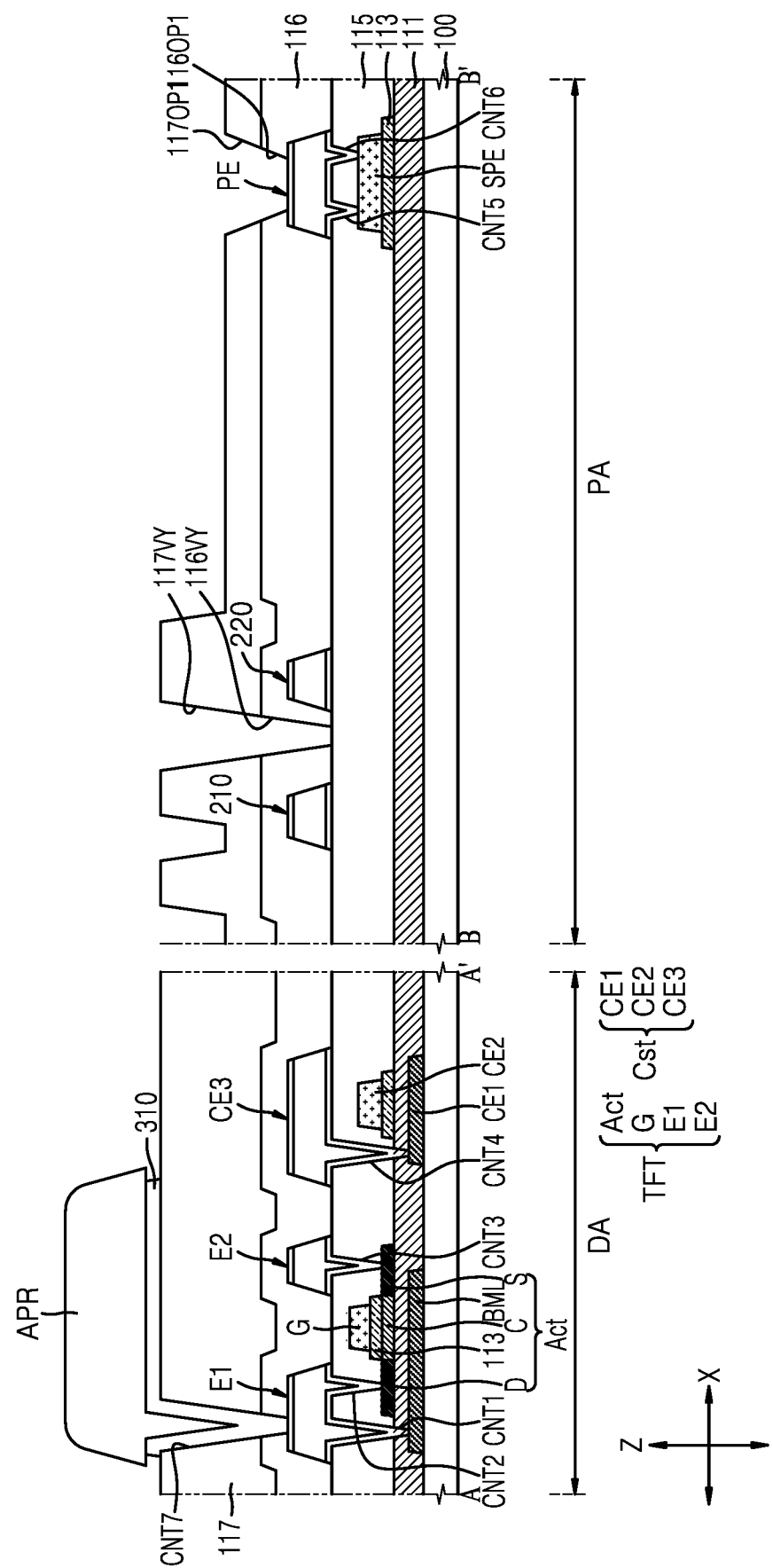

Referring to FIG. 6G, the sub-pixel electrode 310 may be formed on the planarization layer 117. In the forming of the sub-pixel electrode 310, a seventh mask including a pattern corresponding to the sub-pixel electrode 310 may be used, and for example, a photolithography process may be used.

In an embodiment, an anode photoresist pattern APR may be formed on a preliminary sub-pixel electrode layer (not shown) formed on the planarization layer 117. The anode photoresist pattern APR may be formed by using the seventh mask. The sub-pixel electrode 310 may be formed by etching the preliminary sub-pixel electrode layer using the anode photoresist pattern APR as an etching mask. The etching may include, e.g., wet etching.

The sub-pixel electrode 310 may be connected to the first electrode E1 of the thin-film transistor TFT through the seventh contact hole CNT7 defined through the planarization layer 117 and the inorganic insulating layer 116.

Figure 6H:
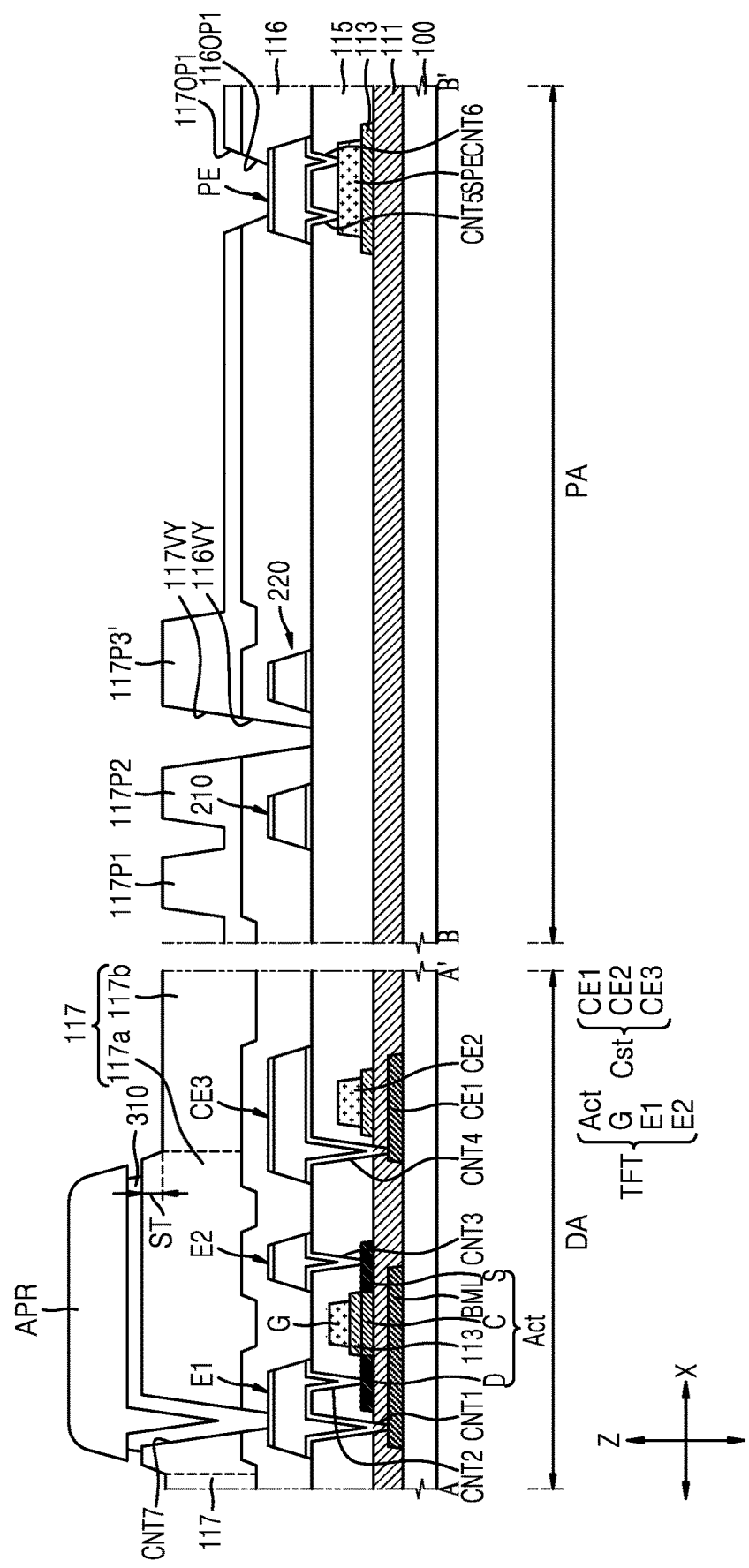

Referring to FIG. 6H, after the sub-pixel electrode 310 is formed, the planarization layer 117 may be partially removed through a primary etching process using the anode photoresist pattern APR as an etching mask. In the primary etching process, for example, an ashing process using oxygen gas may be used.

In the primary etching process, the anode photoresist pattern APR and a portion of the planarization layer 117 not protected (or not covered) by the anode photoresist pattern APR may be removed. Accordingly, an overall thickness of the anode photoresist pattern APR and the portion of the planarization layer 117 which is not protected by the anode photoresist pattern APR may be reduced.

In the primary etching process, first sub-layers 117P1 and 117P2 of the first dam portion DM1 and the second dam portion DM2, and a preliminary first sub-layer 117P3' of a preliminary third dam portion DM3' (see FIG. 6I) may be formed.

The first portion 117a of the planarization layer 117 may correspond to a portion protected by the anode photoresist pattern APR in the primary etching process, and the second portion 117b of the planarization layer 117 may correspond to a portion not protected by the anode photoresist pattern APR in the primary etching process. The upper surface of the planarization layer 117 may have a step ST between the first portion 117a and the second portion 117b.

Figure 6I:
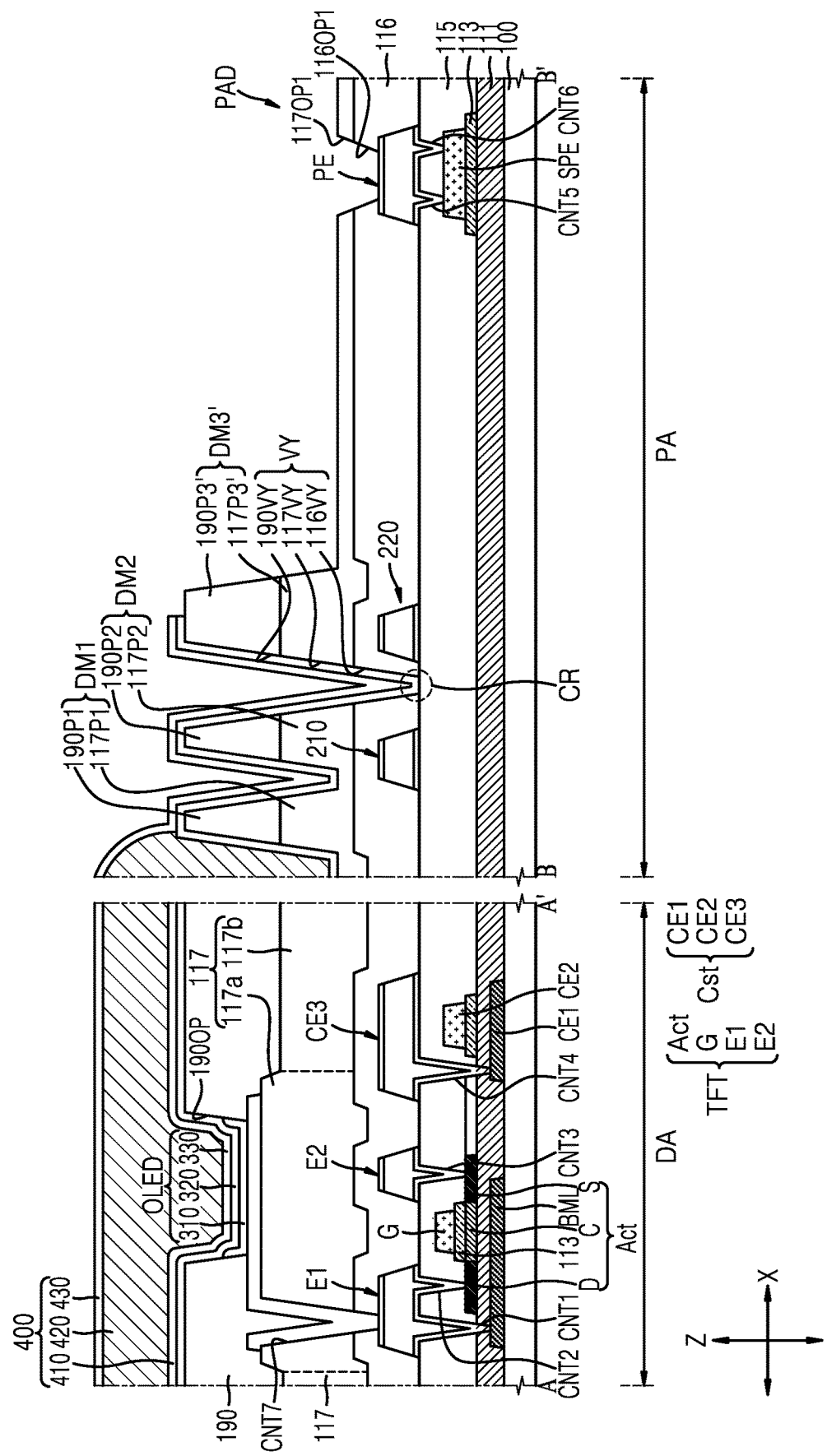

Referring to FIG. 6I, the bank layer 190 may be formed on the sub-pixel electrode 310. The bank layer 190 may be formed to cover the edge of the sub-pixel electrode 310. The opening 190OP exposing a central portion of the sub-pixel electrode 310 may be formed in the bank layer 190. In the forming of the bank layer 190, an eighth mask including a pattern corresponding to the bank layer 190 may be used, and for example, a photolithography process may be used. Also, second sub-layers 190P1 and 190P2 respectively on the first sub-layers 117P1 and 117P2, and a preliminary second sub-layer 190P3' on the preliminary first sub-layer 117P3' may be formed by using the eighth mask. The first sub-layers 117P1 and 117P2 and the second sub-layers 190P1 and 190P2 may constitute the first dam portion DM1 and the second dam portion DM2. The preliminary first sub-layer 117P3' and the preliminary second sub-layer 190P3' may constitute the preliminary third dam portion DM3'. Also, the third valley 190VY overlapping the second valley 117VY of the planarization layer 117 may be formed in the bank layer 190. The first valley 116VY, the second valley 117VY, and the third valley 190VY may constitute the one valley VY.

Thereafter, the emission layer 320 may be formed in the opening 190OP of the bank layer 190. The emission layer 320 may be formed on the sub-pixel electrode 310. The emission layer 320 may be formed by using a vacuum deposition method, a screen printing or inkjet printing method, or a laser thermal transfer method.

The opposite electrode 330 may be formed to cover the display area DA of the substrate 100. The opposite electrode 330 may be formed by using, e.g., a deposition method, such as CVD, TCVD, PECVD, sputtering, or e-beam evaporation.

The encapsulation layer 400 may be formed on the opposite electrode 330. The first inorganic encapsulation layer 410 may be formed by using, e.g., CVD. The first inorganic encapsulation layer 410 may consecutively cover upper and side surfaces of the first dam portion DM1, the second dam portion DM2, and the valley VY, and a portion of an upper surface of the preliminary third dam portion DM3'. The first inorganic encapsulation layer 410 may form an inorganic contact area CR while being in contact with the upper surface of the interlayer insulating layer 115 through the valley VY.

The organic encapsulation layer 420 may be formed on the first inorganic encapsulation layer 410. The organic encapsulation layer 420 may be formed by applying a monomer and then curing the applied monomer, which is an organic encapsulation layer forming material. The monomer may be applied by using, e.g., an inkjet method.

The second inorganic encapsulation layer 430 may be formed on the organic encapsulation layer 420. The second inorganic encapsulation layer 430 may be formed by using, e.g., CVD. Similar to the first inorganic encapsulation layer 410, the second inorganic encapsulation layer 430 may be consecutively cover the upper and side surfaces of the first dam portion DM1, the second dam portion DM2, and the valley VY, and the portion of the upper surface of the preliminary third dam portion DM3'. Ends of the first inorganic encapsulation layer 410 and the second inorganic encapsulation layer 430 may be disposed on the upper surface of the preliminary third dam portion DM3'.

Figure 6J:
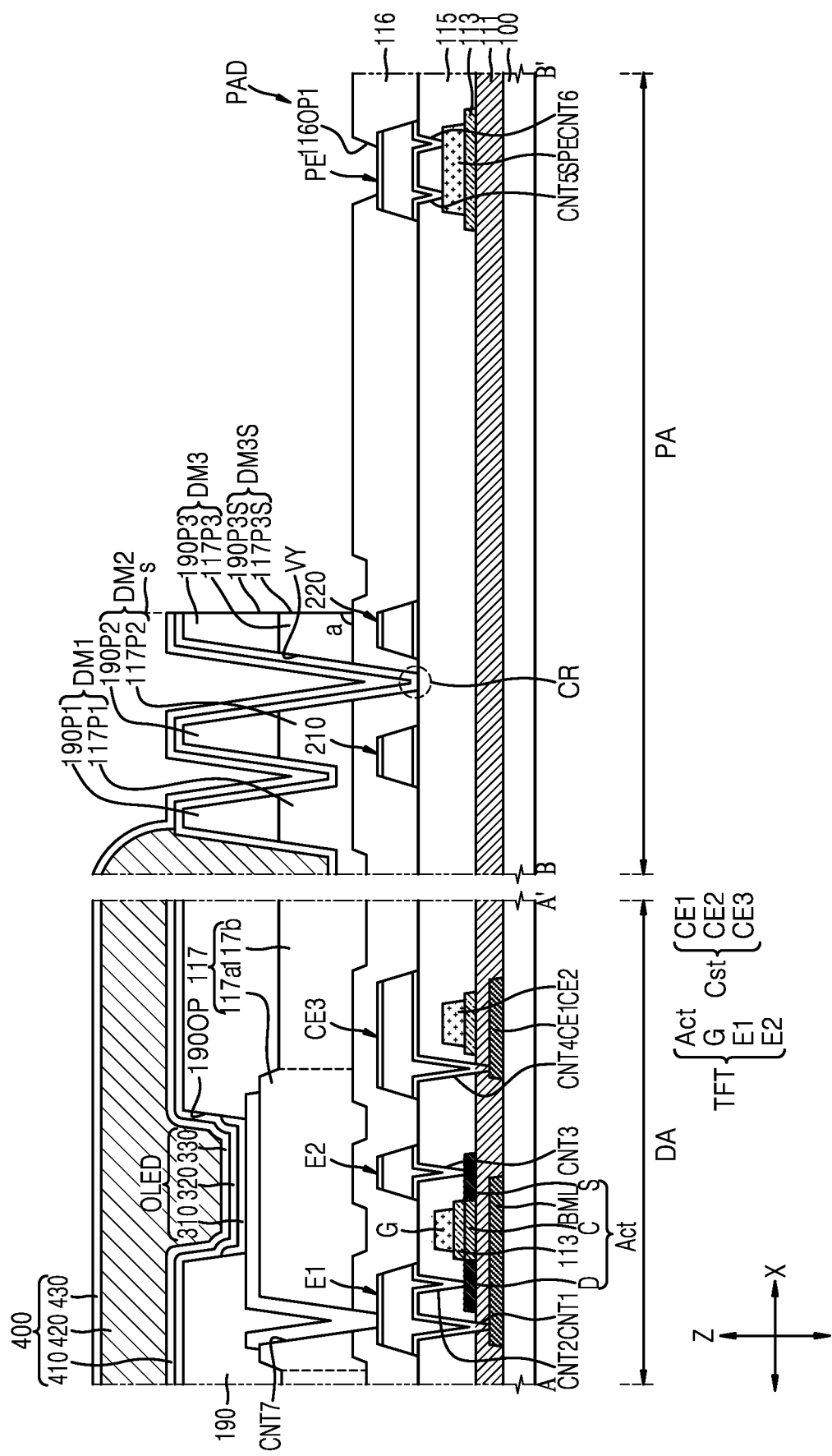

Referring to FIG. 6J, the planarization layer 117 and the bank layer 190 may be partially removed through a secondary etching process using the encapsulation layer 400 as an etching mask. In the secondary etching process, for example, an ashing process using oxygen gas may be used.

In the secondary etching process, a portion of the planarization layer 117 and the bank layer 190 not protected by the encapsulation layer 400, specifically, the first inorganic encapsulation layer 410 or the second inorganic encapsulation layer 430, may be removed. The portion of the planarization layer 117 and the bank layer 190 not protected by the first inorganic encapsulation layer 410 or the second inorganic encapsulation layer 430 may be completely removed from the peripheral area PA. Accordingly, the planarization layer 117 may be provided with an opening overlapping the peripheral area PA, e.g., the pad portion PAD. The planarization layer 117 remaining in the peripheral area PA may function as a moisture permeation path and cause deterioration of a light-emitting element.

Also, a portion of the preliminary third dam portion DM3' not protected by the first inorganic encapsulation layer 410 or the second inorganic encapsulation layer 430 is removed, and accordingly, the third dam portion DM3 may be formed. The first sub-layer 117P3 and the second sub-layer 190P3 of the third dam portion DM3 may be simultaneously formed in the secondary etching process. The first sub-layer 117P3 and the second sub-layer 190P3 may be formed by removing portions of the preliminary first sub-layer 117P3' and the preliminary second sub-layer 190P3', respectively.

The first side surface 117P3S of the first sub-layer 117P3 and the first side surface 190P3S of the second sub-layer 190P3 of the third dam portion DM3 may be positioned on a same etching surface s. The first side surface 117P3S of the first sub-layer 117P3 and the first side surface 190P3S of the second sub-layer 190P3 may together correspond to the first side surface DM3S of the third dam portion DM3.

In an embodiment, the angle a between the first side surface DM3S of the third dam portion DM3 and the upper surface of the substrate 100 may be about 90°. The first side surface DM3S of the third dam portion DM3 may be nearly perpendicular to the upper surface of the substrate 100.

Figure 6K:
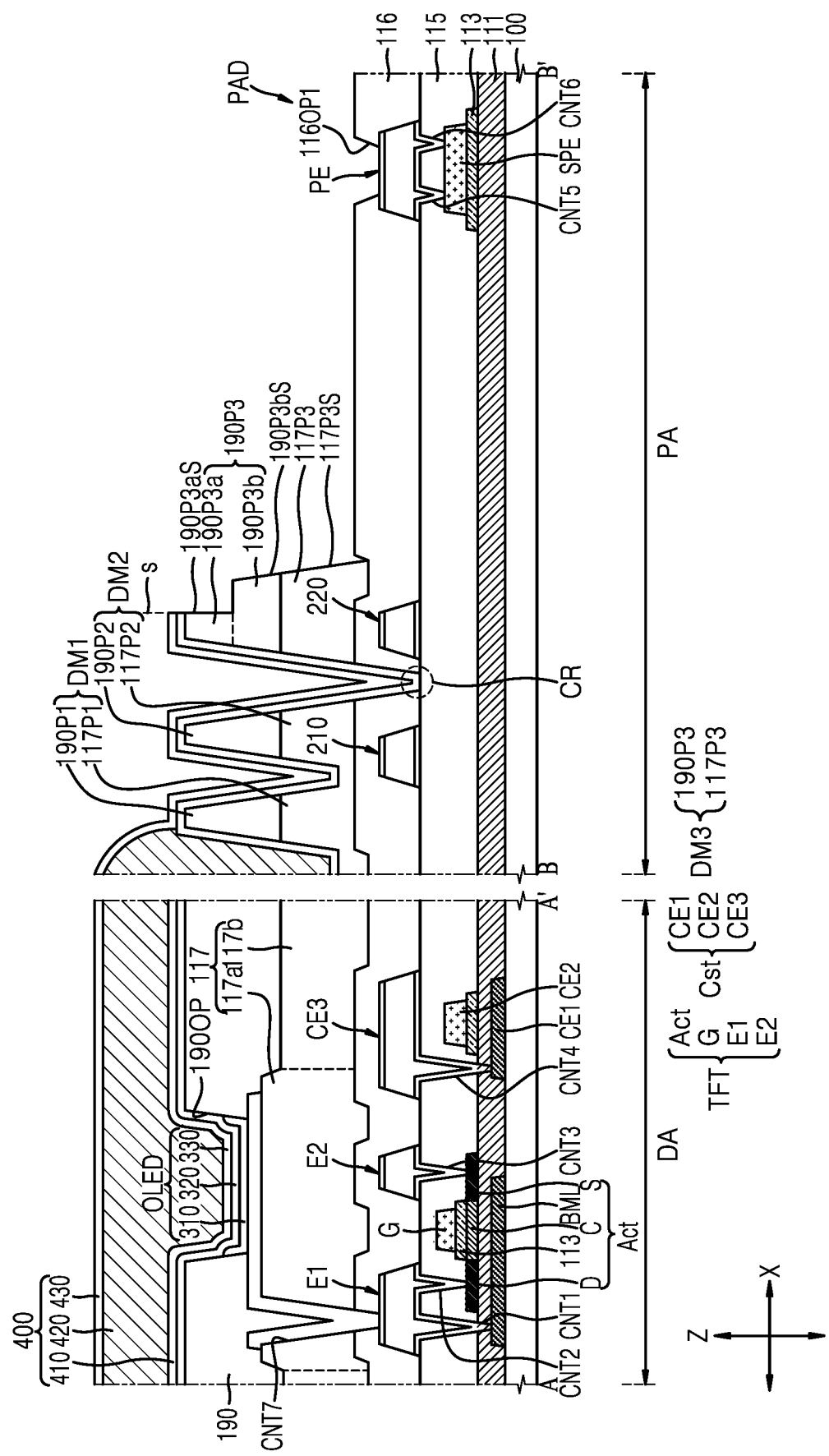

FIG. 6K shows an alternative embodiment of FIG. 6J, and referring to FIG. 6K, in the secondary etching process, the third dam portion DM3 may be formed by removing a portion of the preliminary third dam portion DM3' not protected by the first inorganic encapsulation layer 410 or the second inorganic encapsulation layer 430, and the first sub-layer 117P3 and the second sub-layer 190P3 of the third dam portion DM3 may be formed by removing portions of the preliminary first sub-layer 117P3' and the preliminary second sub-layer 190P3', respectively. Unlike FIG. 6J, according to process conditions, in the secondary etching process, the preliminary first sub-layer 117P3' may hardly be removed, and only a portion of the preliminary second sub-layer 190P3' adjacent to the first inorganic encapsulation layer 410 and the second inorganic encapsulation layer 430 may be removed.

The second sub-layer 190P3 of the third dam portion DM3 may include a first portion 190P3a and a second portion 190P3b. A first side surface 190P3aS of the first portion 190P3a of the second sub-layer 190P3 may be arranged to be adjacent to the display area DA more than a first side surface 190P3bS of the second portion 190P3b is.

The first side surface 190P3aS of the first portion 190P3a of the second sub-layer 190P3 of the third dam portion DM3 may be aligned with an edge of the first inorganic encapsulation layer 410 and/or the second inorganic encapsulation layer 430. The first side surface 190P3aS of the first portion 190P3a may be positioned on the same etching surface s as a side surface of the first inorganic encapsulation layer 410 and/or the second inorganic encapsulation layer 430.

In this case, an angle between the first side surface 190P3aS of the first portion 190P3a of the second sub-layer 190P3 of the third dam portion DM3 and the upper surface of the substrate 100 may be about 90°. The first side surface 190P3aS of the first portion 190P3a of the second sub-layer 190P3 may be nearly perpendicular to the upper surface of the substrate 100.

Also, the first side surface 117P3S of the first sub-layer 117P3 of the third dam portion DM3 and the first side surface 190P3bS of the second portion 190P3b of the second sub-layer 190P3 may be positioned on (or collectively define) the same surface.

Figure 6L:
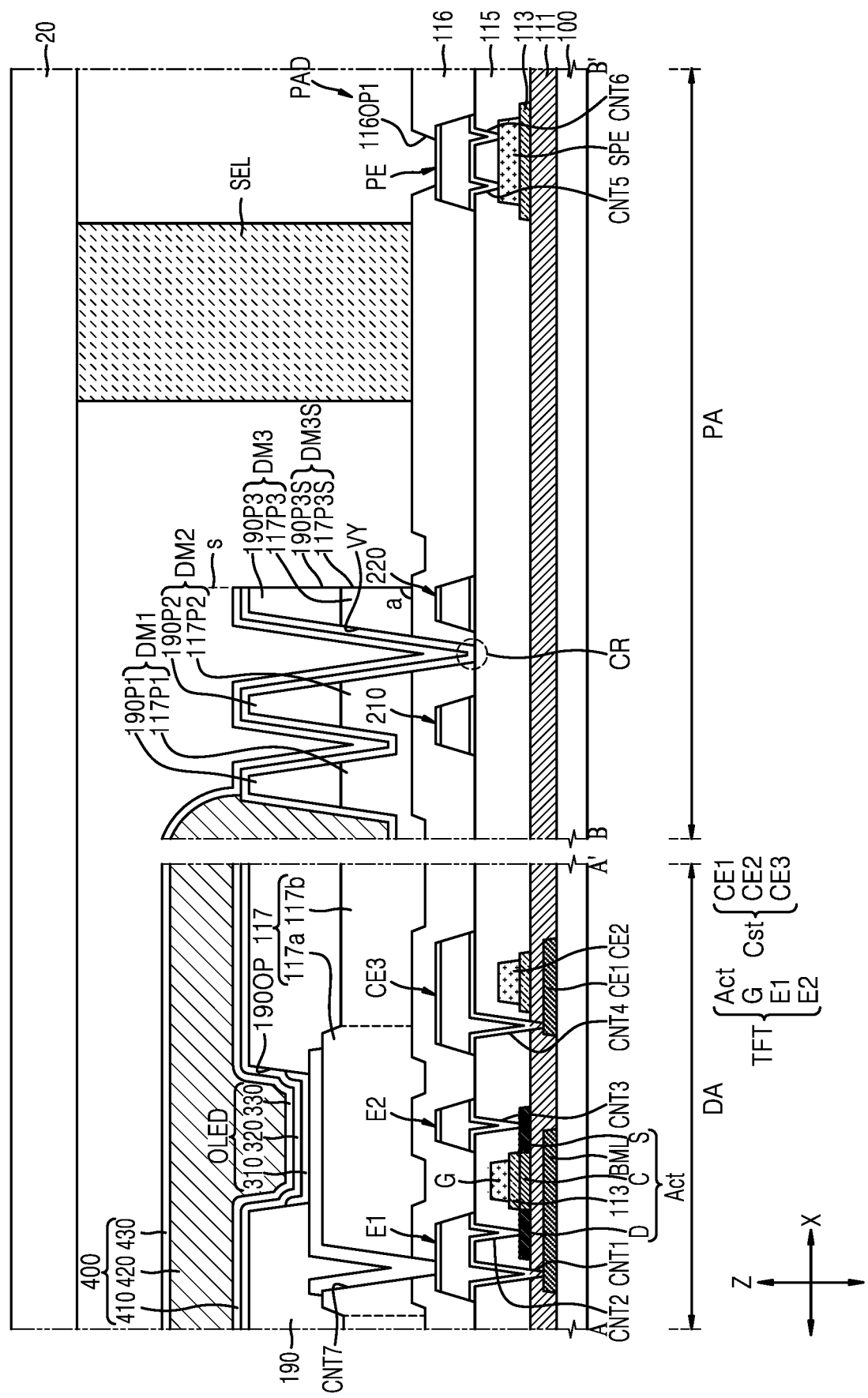

Hereinafter, a structure of FIG. 6J is mainly described. Referring to FIG. 6L, a sealing member SEL may be arranged in a portion of the peripheral area PA where the planarization layer 117 and the bank layer 190 are completely removed.

In an embodiment, the sealing member SEL may include a material cured by laser. In an embodiment, the sealing member SEL may include a sealant or a frit. In an embodiment, the sealing member SEL may include a urethane-based resin, an epoxy-based resin, or an acrylic resin, which are organic sealants, and an inorganic sealant. In some embodiments, the sealing member SEL may include silicon. In an embodiment, for example, urethane acrylate or the like may be used as the urethane-based resin. In an embodiment, for example, butyl acrylate or ethylhexyl acrylate may be used as the acrylic resin. In addition, the sealing member SEL may include a material cured by heat.

Because the planarization layer 117 and the bank layer 190 each including an organic material are completely removed from the peripheral area PA, other organic layers absorb heat or laser when the sealing member SEL is formed, thereby effectively preventing the sealing member SEL from being uncured.

A color panel 20 may be disposed on the sealing member SEL. In an embodiment, for example, the sealing member SEL may be in contact with an upper substrate of the color panel 20 in the peripheral area PA. An inner space between the display panel and the color panel 20 sealed by the sealing member SEL may be sealed, and for example, a filler may be filled in the inner space.

As a comparative example, after a sub-pixel electrode is formed, and a portion of a planarization layer arranged in a peripheral area may be completely removed in an etching process using an anode photoresist pattern as an etching mask. An opening overlapping a pad portion may be formed in the planarization layer. In the etching process, the planarization layer not protected by the anode photoresist pattern is entirely removed, and thus, the planarization layer around the sub-pixel electrode may also be removed. In this case, while a portion of the planarization layer arranged in the peripheral area is completely removed, portions (i.e., first sub-layers) of the planarization layer constituting first and second dam portions or the planarization layer around the sub-pixel electrode may also be removed as much as a corresponding amount.

Accordingly, in this case, a large step may be formed between a first portion of the planarization layer overlapping the sub-pixel electrode and a second portion around the first portion. In this case, a bank layer may not sufficiently cover an edge of the sub-pixel electrode, and a defect may occur in a light-emitting element. Also, thicknesses of first sublayers included in the first and second dam portions are reduced, and thus, an overall thickness of the first and second dam portions may be reduced. Accordingly, a possibility of an organic encapsulation layer overflowing toward an edge of a substrate may increase.

According to one or more embodiments, ad described above, after the sub-pixel electrode 310 is formed, the planarization layer 117 may be partially removed in the primary etching process using the anode photoresist pattern APR as an etching mask, and a portion of the planarization layer 117 remaining in the peripheral area PA may be completely removed through the secondary etching process using the encapsulation layer 400 as an etching mask. After the secondary etching process, an opening overlapping the peripheral area PA, e.g., the pad portion PAD, may be formed in the planarization layer 117.

In an embodiment, in the primary etching process, the planarization layer 117 may be partially removed by adjusting an amount of etching without entirely removing the planarization layer 117 arranged in the peripheral area PA. In such an embodiment, in the primary etching process, an amount of removal of the first sub-layers 117P1 and 117P2 of the planarization layer 117 constituting the first and second dam portions DM1 and DM2 or the planarization layer 117 around the sub-pixel electrode 310 may be reduced. Also, in the secondary etching process, the planarization layer 117 and the bank layer 190 arranged in the display area DA, the first dam portion DM1, and the second dam portion DM2 may be protected by the encapsulation layer 400. Accordingly, the step ST between the first portion 117a of the planarization layer 117 overlapping the sub-pixel electrode 310 and the second portion 117b around the first portion 117a is formed relatively small, and thus, the bank layer 190 may sufficiently cover the edge of the sub-pixel electrode 310. In such an embodiment, an occurrence of a defect in the light-emitting element included in the display apparatus 1 may be reduced. In such an embodiment, thicknesses of the first sub-layers 117P1 and 117P2 included in the first and second dam portions DM1 and DM2 increase, and accordingly, an overall thickness of the first and second dam portions DM1 and DM2 may increase. In such an embodiment, heights of the first dam portion DM1 and the second dam portion DM2 may be formed relatively high such that overflow of the organic encapsulation layer 420 may be reduced.

Also, according to an embodiment, the display apparatus 1 may be manufactured by using a small number of masks, e.g., 8 masks, such that manufacturing costs of the display apparatus 1 may be reduced, and productivity of the display apparatus 1 may be improved.

Figure 7:
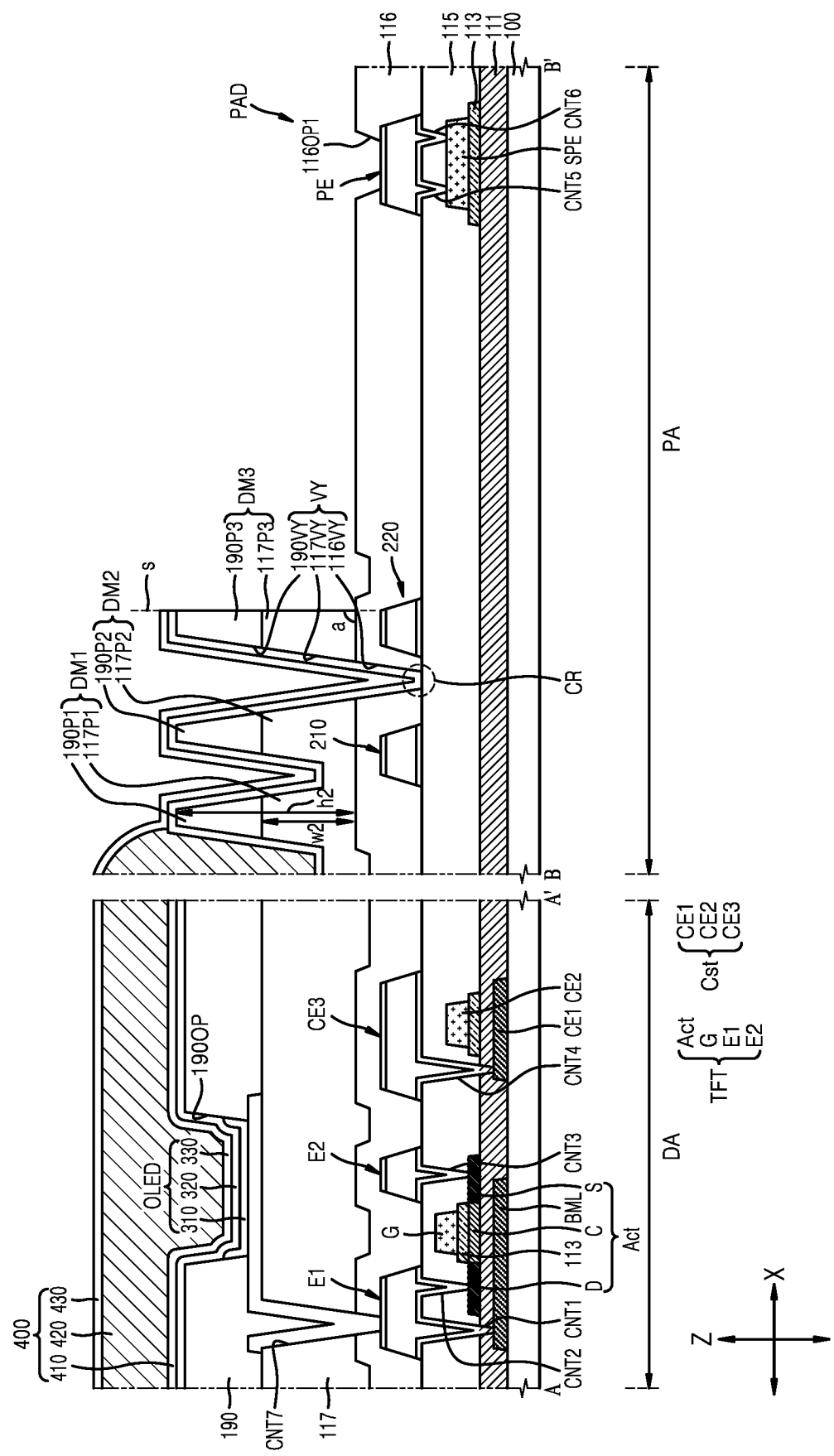
FIG. 7 is a schematic cross-sectional view of a display apparatus according to an alternative embodiment.

FIG. 7 is a schematic cross-sectional view of the display apparatus according to an alternative embodiment. In FIG. 7, the same reference numerals as those in FIG. 5 denote like elements, and any repetitive detailed description thereof will be omitted, and differences will be mainly described below.

Referring to FIG. 7, the display apparatus 1 includes the thin-film transistor TFT and the capacitor Cst arranged over the substrate 100 corresponding to the display area DA, and the pad portion PAD arranged over the substrate 100 corresponding to the peripheral area PA.

In an alternative embodiment, as shown in FIG. 7, the upper surface of the planarization layer 117 of the display area DA may not have a step. The sub-pixel electrode 310 of the organic light-emitting diode OLED may be arranged over the planarization layer 117. The bank layer 190 may be disposed on the planarization layer 117 to cover the edge of the sub-pixel electrode 310. In this case, because the upper surface of the planarization layer 117 has no step between a portion of the planarization layer 117 overlapping the sub-pixel electrode 310 and a surrounding portion, the bank layer 190 may cover the edge of the sub-pixel electrode 310 with a sufficient thickness. Accordingly, an occurrence of a defect, such as a dark spot, in the organic light-emitting diode OLED may further be reduced.

Also, In such an embodiment, thicknesses of the first sub-layers 117P1, 117P2, and 117P3 constituting the first dam portion DM1, the second dam portion DM2, and the third dam portion DM3 of the peripheral area PA may be relatively high compared to the embodiment of FIG. 5. In an embodiment, for example, a thickness w2 of the first sub-layer 117P1 of the first dam portion DM1 in FIG. 7 may be greater than a thickness w1 of the first sub-layer 117P1 of the first dam portion DM1 in FIG. 5. Accordingly, a thickness h2 of the first dam portion DM1 may be greater than a thickness h1 of the first dam portion DM1 in FIG. 5. As the thicknesses of the first to third dam portions DM1, DM2, and DM3 increase, a possibility of the organic encapsulation layer 420 overflowing toward the edge of the substrate 100 may further be reduced.

FIGS. 8A to 8G are cross-sectional views of a method of manufacturing a display apparatus, according to an alternative embodiment. In detail, FIGS. 8A to 8G are cross-sectional views sequentially illustrating a method of manufacturing a display apparatus, according to an alternative embodiment. FIGS. 8A to 8G are modified embodiments of FIGS. 6A to 6L, and thus, differences will be mainly described, and any repetitive detailed description thereof will be omitted. The processes of FIG. 6A to 6E described above may be equally applied to manufacturing the display apparatus of FIG. 7.

Figure 8A:
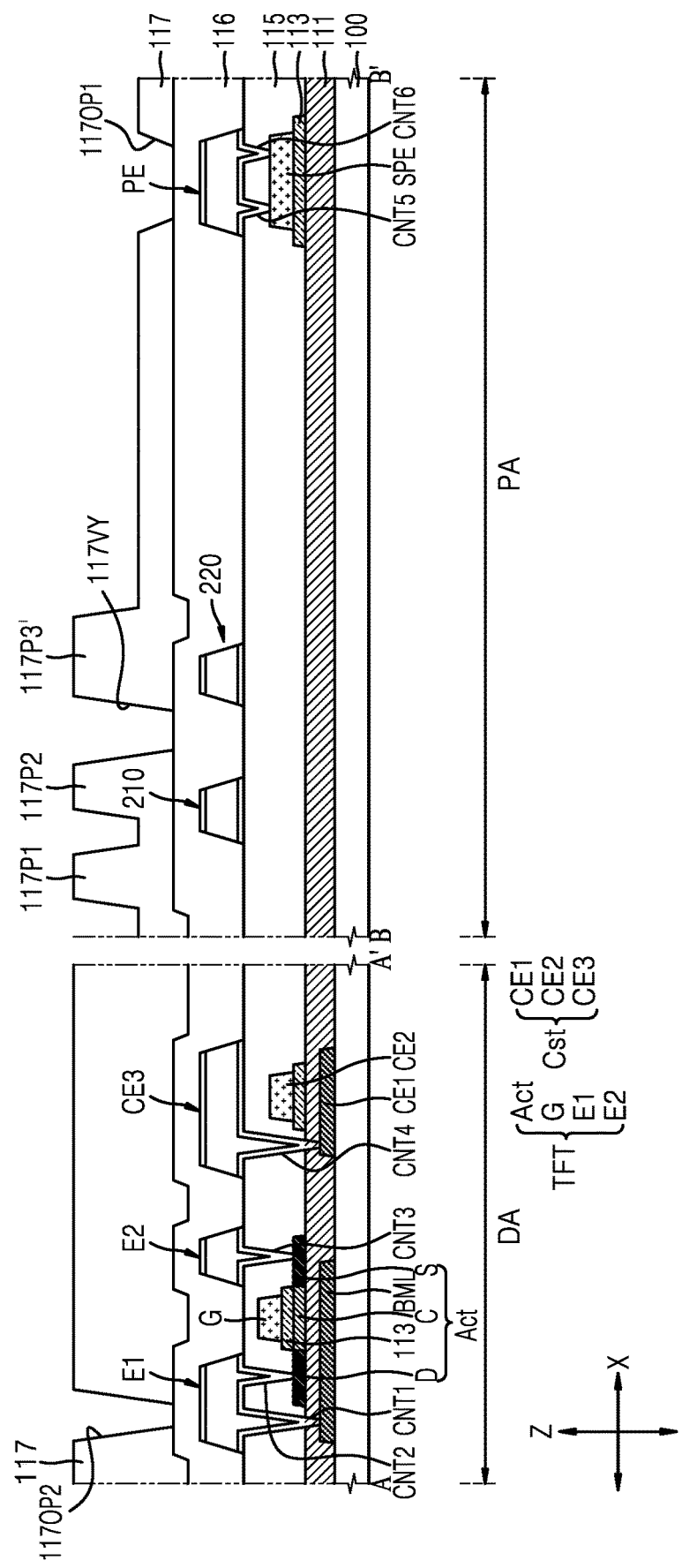
FIGS. 8A to 8G are cross-sectional views of a method of manufacturing a display apparatus, according to an alternative embodiment.

Referring to FIG. 8A, the patterned planarization layer 117 may be provided with the first opening 117OP1 overlapping the pad electrode PE, the second opening 117OP2 overlapping the second electrode E2, and the second valley 117VY. Also, the patterned planarization layer 117 may include the first sub-layers 117P1 and 117P2 of the first dam portion DM1 and the second dam portion DM2, and the preliminary first sub-layer 117P3' of the preliminary third dam portion DM3' (see FIG. 6I).

Figure 8B:
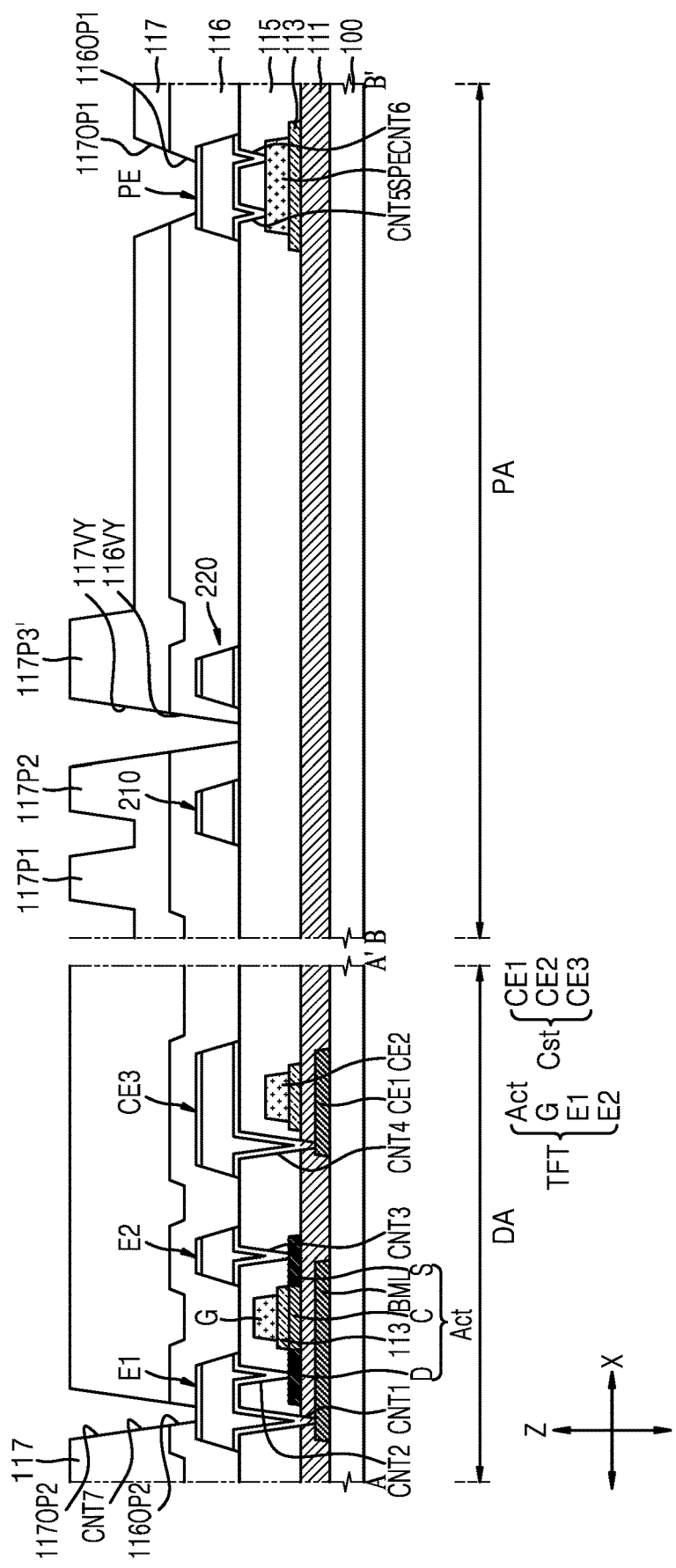

Referring to FIG. 8B, the inorganic insulating layer 116 may be etched by using the patterned planarization layer 117 as an etching mask. In an etching process, a portion of the inorganic insulating layer 116 is removed, and accordingly, the first opening 116OP1 and a second opening 116OP2 of the inorganic insulating layer 116 may be formed. The first opening 116OP1 of the inorganic insulating layer 116 may overlap the first opening 117OP1 of the planarization layer 117 and expose the pad electrode PE. The second opening 116OP2 of the inorganic insulating layer 116 may overlap the second opening 117OP2 of the planarization layer 117 and expose the first electrode E1. The second opening 116OP2 of the inorganic insulating layer 116 and the second opening 117OP2 of the planarization layer 117 may constitute the seventh contact hole CNT7.

Also, a portion of the inorganic insulating layer 116 is removed, and accordingly, the first valley 116VY of the inorganic insulating layer 116 may be formed. The first valley 116VY of the inorganic insulating layer 116 may overlap the second valley 117VY of the planarization layer 117 and expose the interlayer insulating layer 115.

Figure 8C:
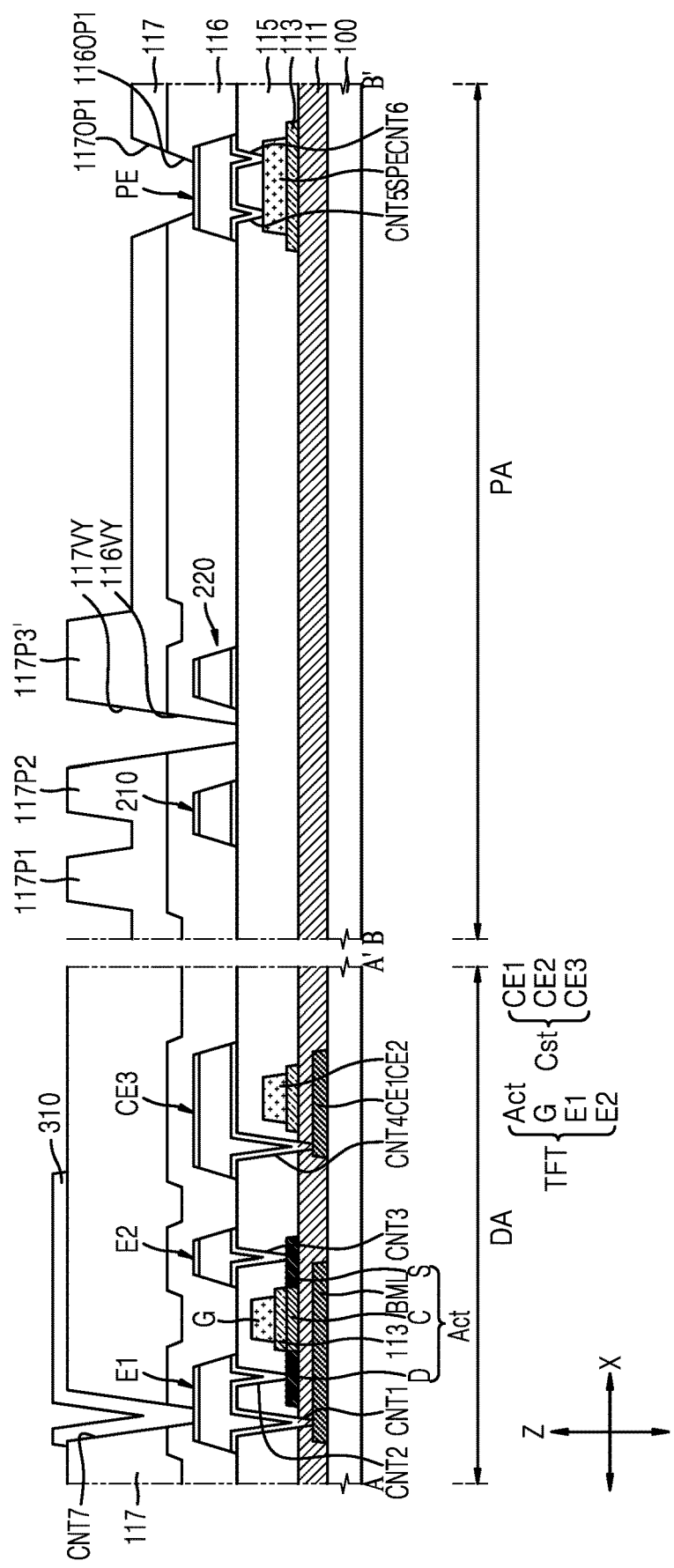

Referring to FIG. 8C, the sub-pixel electrode 310 may be formed on the planarization layer 117. The sub-pixel electrode 310 may be connected to the first electrode E1 of the thin-film transistor TFT through the seventh contact hole CNT7 defined through the planarization layer 117 and the inorganic insulating layer 116. In the forming of the sub-pixel electrode 310, a seventh mask including a pattern corresponding to the sub-pixel electrode 310 may be used, and for example, a photolithography process may be used.

Unlike FIGS. 5 and 6H, after the sub-pixel electrode 310 is formed, an etching process of partially removing the planarization layer 117 using the anode photoresist pattern APR (see FIG. 6H) as an etching mask may not be performed. In this case, unlike FIG. 6H, the first sub-layers 117P1 and 117P2 of the planarization layer 117 constituting the first and second dam portions DM1 and DM2 and the planarization layer 117 around the sub-pixel electrode 310 may not be removed. That is, the upper surface of the planarization layer 117 may not have a step between a portion of the planarization layer 117 overlapping the sub-pixel electrode 310 and a surrounding portion.

Figure 8D:
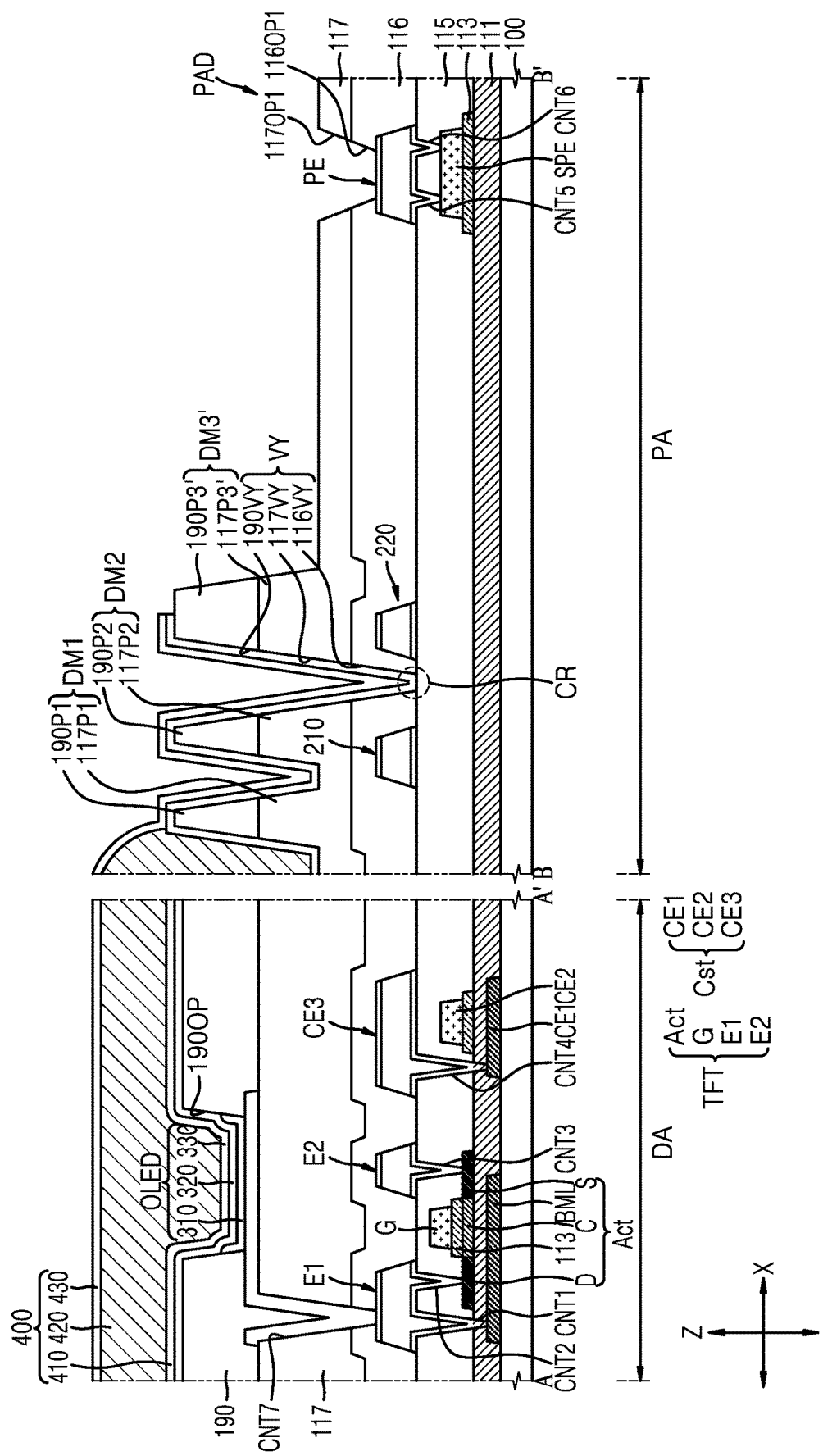

Referring to FIG. 8D, the bank layer 190 may be formed on the sub-pixel electrode 310. The bank layer 190 may be formed to cover the edge of the sub-pixel electrode 310 and may include the opening 190OP exposing a central portion of the sub-pixel electrode 310. In the forming of the bank layer 190, an eighth mask including a pattern corresponding to the bank layer 190 may be used, and for example, a photolithography process may be used. Also, the second sub-layers 190P1 and 190P2 respectively on the first sub-layers 117P1 and 117P2, and the preliminary second sub-layer 190P3' on the preliminary first sub-layer 117P3' may be formed by using the eighth mask. Also, the third valley 190VY overlapping the second valley 117VY of the planarization layer 117 may be formed in the bank layer 190. The first valley 116VY, the second valley 117VY, and the third valley 190VY may constitute the one valley VY.

Thereafter, the emission layer 320 may be formed in the opening 190OP of the bank layer 190. The opposite electrode 330 may be formed on the emission layer 320. The encapsulation layer 400 may be formed on the opposite electrode 330. The first inorganic encapsulation layer 410 may consecutively cover the upper and side surfaces of the first dam portion DM1, the second dam portion DM2, and the valley VY, and a portion of the upper surface of the preliminary third dam portion DM3'. The first inorganic encapsulation layer 410 may form an inorganic contact area CR while being in contact with the upper surface of the interlayer insulating layer 115 through the valley VY.

The organic encapsulation layer 420 may be formed on the first inorganic encapsulation layer 410. The second inorganic encapsulation layer 430 may be formed on the organic encapsulation layer 420. Similar to the first inorganic encapsulation layer 410, the second inorganic encapsulation layer 430 may be consecutively cover the upper and side surfaces of the first dam portion DM1, the second dam portion DM2, and the valley VY, and the portion of the upper surface of the preliminary third dam portion DM3'. The ends of the first inorganic encapsulation layer 410 and the second inorganic encapsulation layer 430 may be disposed on the upper surface of the preliminary third dam portion DM3'.

Figure 8E:
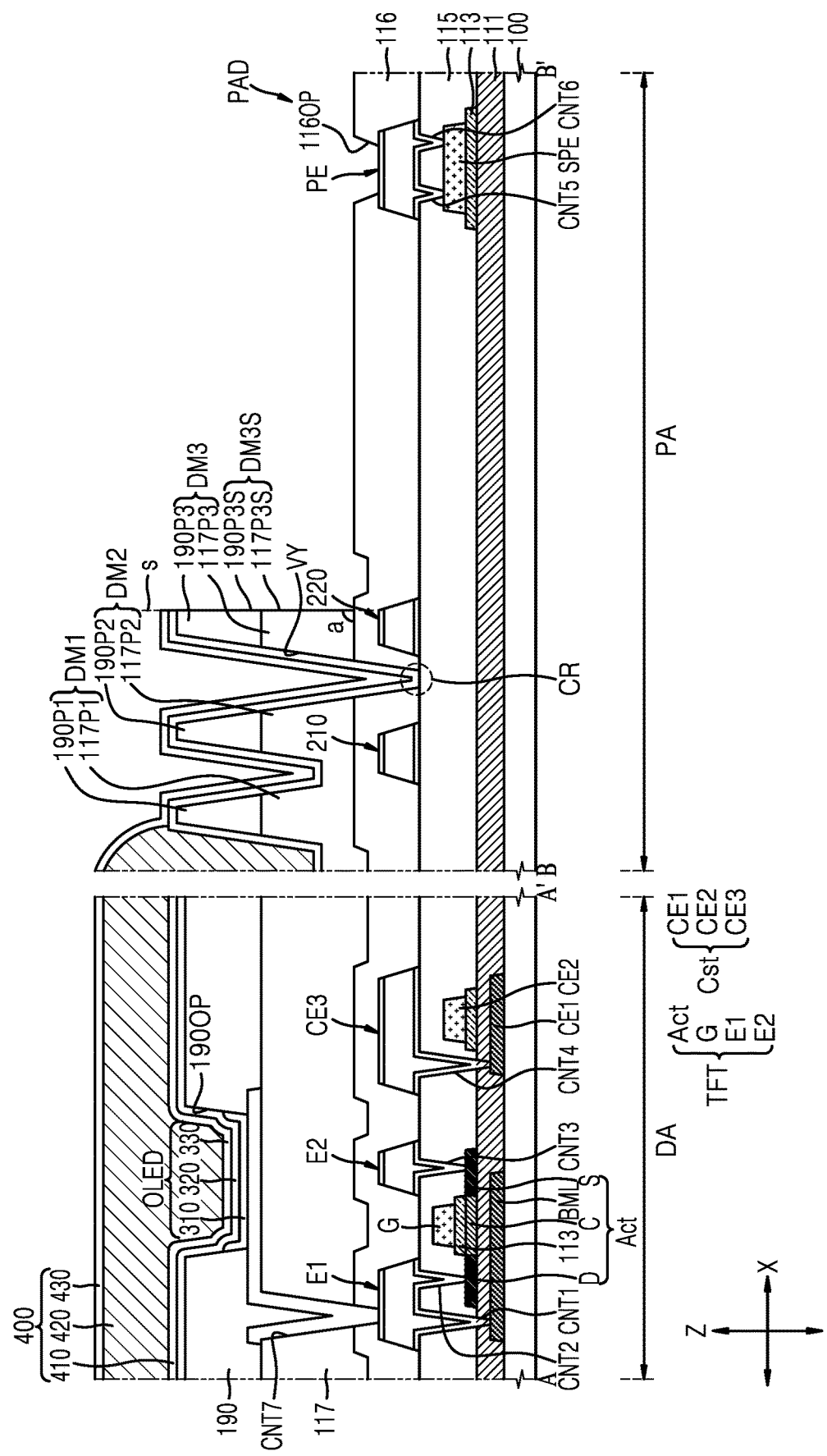

Referring to FIG. 8E, the planarization layer 117 and the bank layer 190 may be partially removed through an etching process using the encapsulation layer 400 as an etching mask. In the etching process, for example, an ashing process using oxygen gas may be used.

In the etching process, a portion of the planarization layer 117 and the bank layer 190 not protected by the encapsulation layer 400, specifically, the first inorganic encapsulation layer 410 or the second inorganic encapsulation layer 430 may be removed. The portion of the planarization layer 117 and the bank layer 190 not protected by the first inorganic encapsulation layer 410 or the second inorganic encapsulation layer 430 may be completely removed from the peripheral area PA. Accordingly, the planarization layer 117 may include an opening overlapping the peripheral area PA, e.g., the pad portion PAD. The planarization layer 117 remaining in the peripheral area PA may function as a moisture permeation path and cause deterioration of a light-emitting element.

In such an embodiment, a portion of the preliminary third dam portion DM3' not protected by the first inorganic encapsulation layer 410 or the second inorganic encapsulation layer 430 is removed, and accordingly, the third dam portion DM3 may be formed. The first sub-layer 117P3 and the second sub-layer 190P3 of the third dam portion DM3 may be simultaneously formed in the etching process. The first sub-layer 117P3 and the second sub-layer 190P3 may be formed by removing portions of the preliminary first sub-layer 117P3' and the preliminary second sub-layer 190P3', respectively.

The first side surface 117P3S of the first sub-layer 117P3 and the first side surface 190P3S of the second sub-layer 190P3 of the third dam portion DM3 may be positioned on the same etching surface s. The first side surface 117P3S of the first sub-layer 117P3 and the first side surface 190P3S of the second sub-layer 190P3 may together correspond to the first side surface DM3S of the third dam portion DM3.

In an embodiment, the angle a between the first side surface DM3S of the third dam portion DM3 and the upper surface of the substrate 100 may be about 90°. The first side surface DM3S of the third dam portion DM3 may be nearly perpendicular to the upper surface of the substrate 100.

Figure 8F:
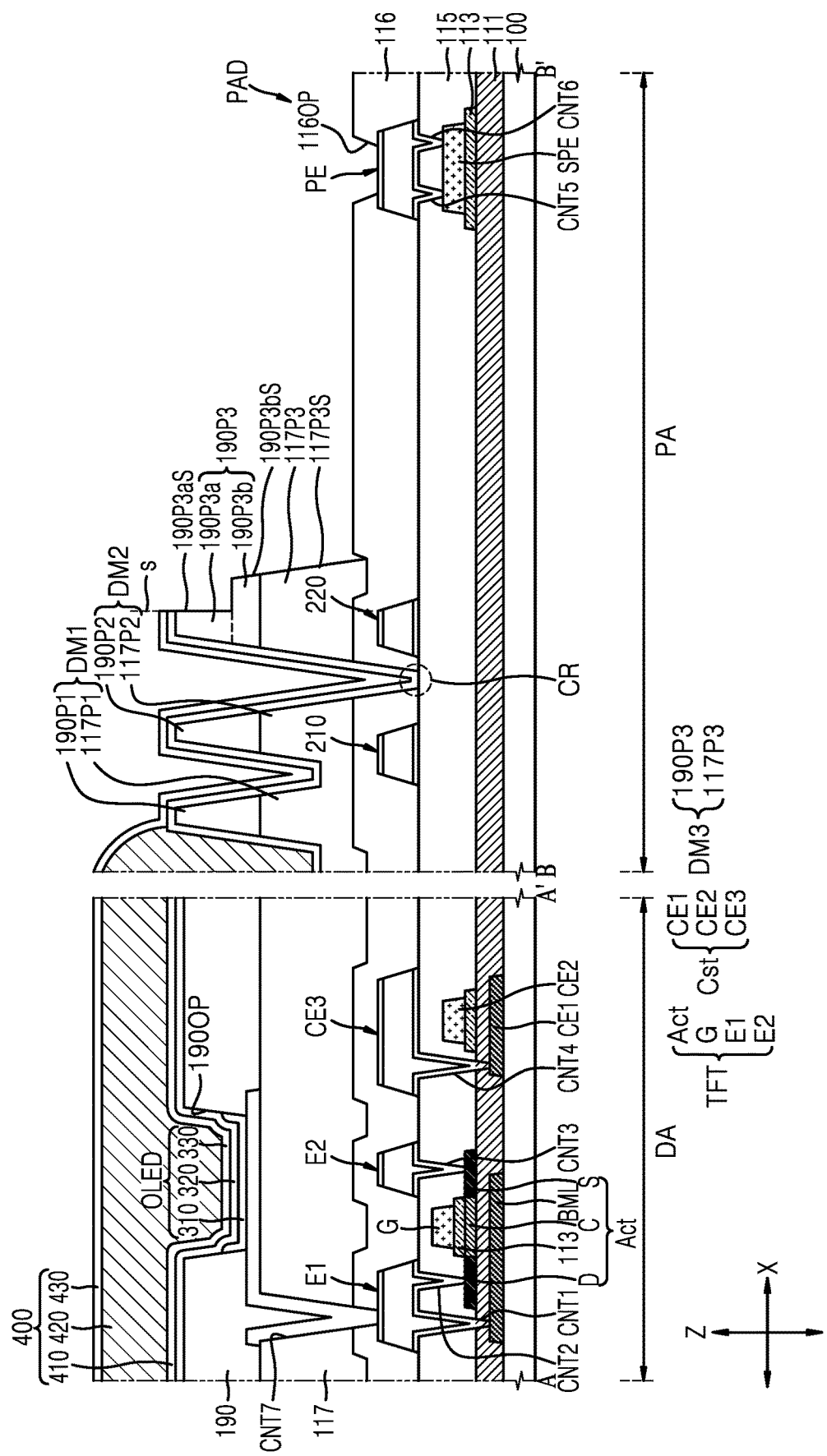

FIG. 8F shows as another alternative embodiment of FIG. 8E, and referring to FIG. 8F, in the etching process, the third dam portion DM3 may be formed by removing a portion of the preliminary third dam portion DM3' not protected by the first inorganic encapsulation layer 410 or the second inorganic encapsulation layer 430, and the first sub-layer 117P3 and the second sub-layer 190P3 of the third dam portion DM3 may be formed by removing portions of the preliminary first sub-layer 117P3' and the preliminary second sub-layer 190P3', respectively. Unlike FIG. 8E, according to process conditions, in the etching process, the preliminary first sub-layer 117P3' may hardly be removed, and only a portion of the preliminary second sub-layer 190P3' adjacent to the first inorganic encapsulation layer 410 and the second inorganic encapsulation layer 430 may be removed.

The second sub-layer 190P3 of the third dam portion DM3 may include the first portion 190P3a and the second portion 190P3b. The first side surface 190P3aS of the first portion 190P3a of the second sub-layer 190P3 may be arranged to be adjacent to the display area DA more than the first side surface 190P3bS of the second portion 190P3b is.

The first side surface 190P3aS of the first portion 190P3a of the second sub-layer 190P3 of the third dam portion DM3 may be aligned with the edge of the first inorganic encapsulation layer 410 and/or the second inorganic encapsulation layer 430. The first side surface 190P3aS of the first portion 190P3a may be positioned on the same etching surface s as the side surface of the first inorganic encapsulation layer 410 and/or the second inorganic encapsulation layer 430.

In this case, an angle between the first side surface 190P3aS of the first portion 190P3a of the second sub-layer 190P3 of the third dam portion DM3 and the upper surface of the substrate 100 may be about 90°. The first side surface 190P3aS of the first portion 190P3a of the second sub-layer 190P3 may be nearly perpendicular to the upper surface of the substrate 100.

Also, the first side surface 117P3S of the first sub-layer 117P3 of the third dam portion DM3 and the first side surface 190P3bS of the second portion 190P3b of the second sub-layer 190P3 may be positioned on the same surface.

Figure 8G:
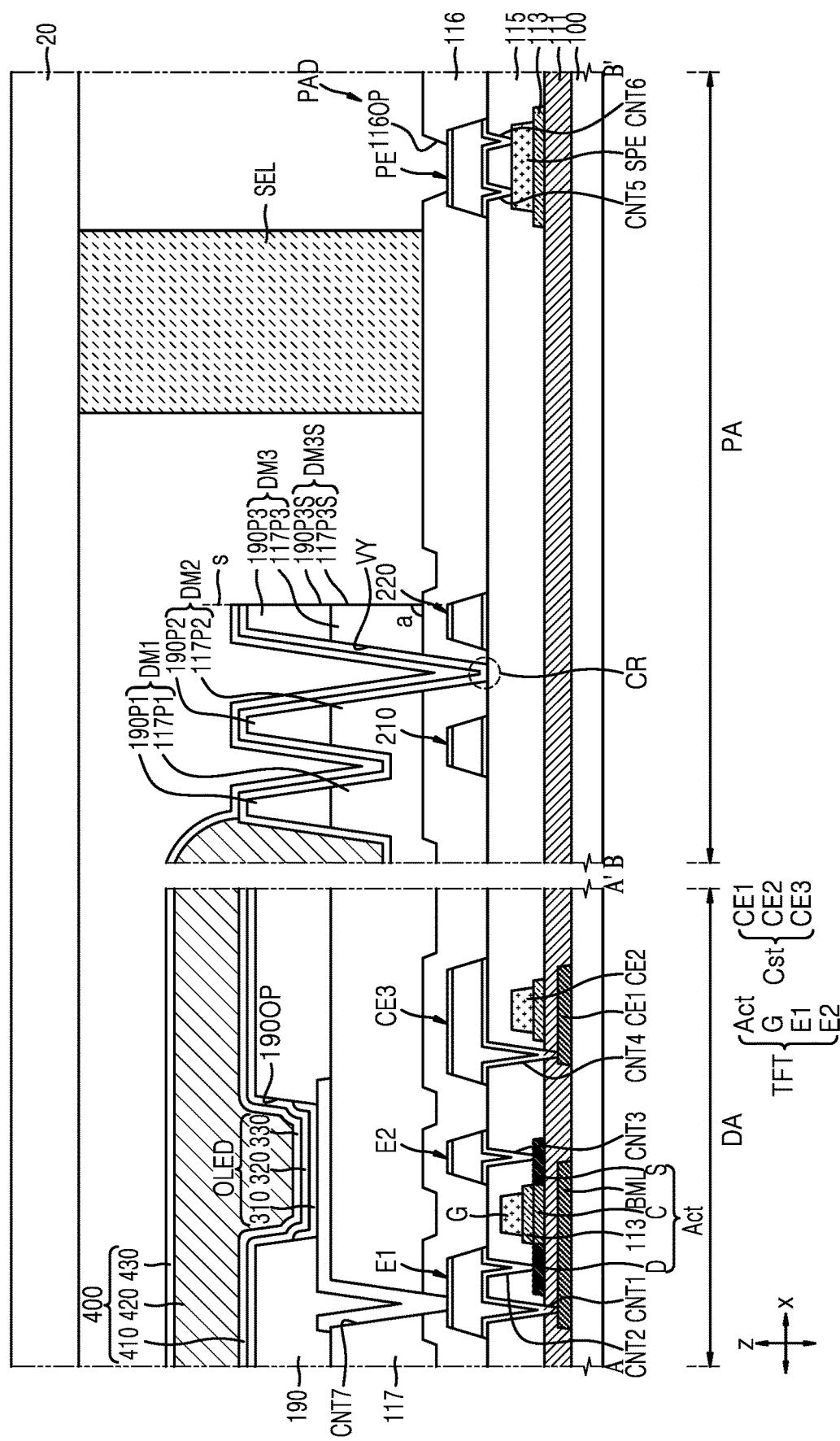

Referring to FIG. 8G, the sealing member SEL may be arranged in a portion of the peripheral area PA where the planarization layer 117 and the bank layer 190 are completely removed. Because the planarization layer 117 and the bank layer 190 each including an organic material are completely removed from the peripheral area PA, other organic layers absorb heat or laser when the sealing member SEL is formed, thereby preventing the sealing member SEL from being uncured.

The color panel 20 may be disposed on the sealing member SEL. In an embodiment, for example, the sealing member SEL may be in contact with the upper substrate of the color panel 20 in the peripheral area PA. An inner space between the display panel and the color panel 20 sealed by the sealing member SEL may be sealed, and a filler may be arranged in the inner space.

Referring to FIGS. 8A to 8E, in an embodiment, after the sub-pixel electrode 310 is formed, without performing an etching process using the anode photoresist pattern APR as an etching mask, a portion of the planarization layer 117 arranged in the peripheral area PA may be completely removed by performing only an etching process using the encapsulation layer 400 as an etching mask. After the etching process of FIG. 8E, an opening overlapping the peripheral area PA, e.g., the pad portion PAD, may be formed in the planarization layer 117.

In such an embodiment, after the sub-pixel electrode 310 is formed, the etching process using the anode photoresist pattern APR as an etching mask is not performed, and thus, the upper surface of the planarization layer 117 may not have a step between a portion of the planarization layer 117 overlapping the sub-pixel electrode 310 and a surrounding portion. Accordingly, an occurrence of a defect, such as a dark spot, in the organic light-emitting diode OLED, which is a light-emitting element, may further be reduced.

Also, in comparison with a case in which, after the sub-pixel electrode 310 is formed, an etching process using the anode photoresist pattern APR as an etching mask is performed, thicknesses of the first sub-layers 117P1, 117P2, and 117P3 constituting the first dam portion DM1, the second dam portion DM2, and the third dam portion DM3 of the peripheral area PA may increase. Accordingly, the thicknesses of the first dam portion DM1, the second dam portion DM2, and the third dam portion DM3 of the peripheral area PA may increase. Therefore, the possibility of the organic encapsulation layer 420 overflowing toward the edge of the substrate 100 may further be reduced such that reliability of the display apparatus 1 may be improved.

According to the one or embodiments described above, the display apparatus capable of reducing the number of masks applied to a manufacturing process, improving productivity, and preventing an occurrence of defects in a light-emitting element, and the method of manufacturing the display apparatus may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
a substrate including a display area and a peripheral area outside the display area;
a first insulating layer disposed on the substrate in the display area and the peripheral area;
a thin-film transistor disposed on the substrate in the display area;
a light-emitting diode electrically connected to the thin-film transistor and including a sub-pixel electrode, an emission layer, and an opposite electrode;
an encapsulation layer disposed on the light-emitting diode and including a first inorganic encapsulation layer, a second inorganic encapsulation layer, and an organic encapsulation layer between the first inorganic encapsulation layer and the second inorganic encapsulation layer; and
a first dam portion and a second dam portion, which are disposed on the first insulating layer of the peripheral area and arranged in a direction from the display area toward the peripheral area,
wherein a first valley is defined through the first insulating layer between the first dam portion and the second dam portion.

2. The display apparatus of claim 1, further comprising:
a second insulating layer between the first insulating layer and the sub-pixel electrode of the light-emitting diode,
wherein an opening overlapping the peripheral area is defined through the second insulating layer,
wherein a second valley overlapping the first valley is defined through the second insulating layer.

3. The display apparatus of claim 1, wherein
the first inorganic encapsulation layer and the second inorganic encapsulation layer extend to the peripheral area, and
a first portion of the first inorganic encapsulation layer and a first portion of the second inorganic encapsulation layer are in direct contact with each other on the first dam portion.

4. The display apparatus of claim 1, wherein the first inorganic encapsulation layer is in contact with an inorganic insulating layer under the first insulating layer, through the first valley.

5. The display apparatus of claim 1, wherein an end the first inorganic encapsulation layer and an end of the second inorganic encapsulation layer is disposed on the second dam portion.

6. The display apparatus of claim 5, wherein the end of the first inorganic encapsulation layer or the end of the second inorganic encapsulation layer is aligned with an edge of the second dam portion, on a plane.

7. The display apparatus of claim 2, wherein the second insulating layer includes:
a first portion overlapping the sub-pixel electrode; and
a second portion extending from the first portion, and an upper surface of the second insulating layer has a step between the first portion and the second portion.

8. The display apparatus of claim 7, wherein a vertical distance from the substrate to an upper surface of the first portion is greater than a vertical distance from the substrate to an upper surface of the second portion.

9. A display apparatus comprising:
a substrate including a display area and a peripheral area outside the display area;
a first insulating layer disposed on the substrate in the display area and the peripheral area;
a thin-film transistor disposed on the substrate in the display area;
a light-emitting diode electrically connected to the thin-film transistor and including a sub-pixel electrode, an emission layer, and an opposite electrode;
an encapsulation layer disposed on the light-emitting diode and including a first inorganic encapsulation layer, a second inorganic encapsulation layer, and an organic encapsulation layer between the first inorganic encapsulation layer and the second inorganic encapsulation layer; and
a first dam portion and a second dam portion, which are disposed on the first insulating layer of the peripheral area and arranged in a direction from the display area toward the peripheral area,
wherein an end of the first inorganic encapsulation layer and an end of the second inorganic encapsulation layer is disposed on the second dam portion, and
the end of the first inorganic encapsulation layer or the end of the second inorganic encapsulation layer is aligned with an edge of the second dam portion, on a plane.

10. The display apparatus of claim 9, wherein
the second dam portion includes a first sub-layer and a second sub-layer disposed on the first sub-layer, and
a first side surface of the first sub-layer and a first side surface of the second sub-layer are defined by a same etching surface.

11. The display apparatus of claim 10, wherein a first side surface of the second dam portion is perpendicular to an upper surface of the substrate.

12. The display apparatus of claim 9, further comprising:
a second insulating layer between the first insulating layer and the sub-pixel electrode of the light-emitting diode, wherein an opening overlapping the peripheral area is defined through the second insulating layer,
wherein the second insulating layer includes:
a first portion overlapping the sub-pixel electrode; and
a second portion extending from the first portion, and
an upper surface of the second insulating layer has a step between the first portion and the second portion.

13. The display apparatus of claim 12, wherein a vertical distance from the substrate to an upper surface of the first portion is greater than a vertical distance from the substrate to an upper surface of the second portion.

14. A method of manufacturing a display apparatus, the method comprising:
preparing a substrate including a display area and a peripheral area outside the display area;
forming a thin-film transistor on the substrate in the display area;
forming a first insulating layer on the substrate in the display area to cover the thin-film transistor and in the peripheral area;
forming a light-emitting diode on a portion of the first insulating layer in the display area, wherein the light-emitting diode is electrically connected to the thin-film transistor and includes a sub-pixel electrode, an emission layer, and an opposite electrode;
forming an encapsulation layer on the light-emitting diode, wherein the encapsulation layer includes a first inorganic encapsulation layer, a second inorganic encapsulation layer, and an organic encapsulation layer between the first inorganic encapsulation layer and the second inorganic encapsulation layer; and
forming a first dam portion and a second dam portion on the first insulating layer of the peripheral area, wherein the first dam portion and the second dam portion are arranged in a direction from the display area toward the peripheral area,
wherein a first valley is formed through the first insulating layer between the first dam portion and the second dam portion.

15. The method of claim 14, further comprising:
forming a second insulating layer between the first insulating layer and the sub-pixel electrode of the light-emitting diode,
wherein a second valley overlapping the first valley is formed through the second insulating layer.

16. The method of claim 15, wherein the forming the second insulating layer is performed by using a half-tone mask.

17. The method of claim 14, wherein the first inorganic encapsulation layer is in contact with an inorganic insulating layer under the first insulating layer, through the first valley.

18. The method of claim 14, wherein the forming the second dam portion comprises:
forming a preliminary second dam portion on the first insulating layer of the peripheral area; and
etching the preliminary second dam portion by using the encapsulation layer as an etching mask.

19. The method of claim 14, wherein
the second dam portion includes a first sub-layer and a second sub-layer disposed on the first sub-layer, and
a first side surface of the first sub-layer and a first side surface of the second sub-layer are defined by a same etching surface.

20. The method of claim 19, wherein a first side surface of the second dam portion is perpendicular to an upper surface of the substrate.

21. The method of claim 14, wherein an end of the first inorganic encapsulation layer or an end of the second inorganic encapsulation layer is aligned with an edge of the second dam portion, on a plane.

22. The method of claim 15, wherein the second insulating layer includes:
a first portion overlapping the sub-pixel electrode; and
a second portion extending from the first portion, and
an upper surface of the second insulating layer has a step between the first portion and the second portion.

23. The method of claim 22, wherein a vertical distance from the substrate to an upper surface of the first portion is greater than a vertical distance from the substrate to an upper surface of the second portion.

* * * * *